United States Patent
Sankaran

(10) Patent No.: US 7,885,473 B2
(45) Date of Patent: Feb. 8, 2011

(54) METHOD OF CABAC COEFFICIENT MAGNITUDE AND SIGN DECODING SUITABLE FOR USE ON VLIW DATA PROCESSORS

(75) Inventor: Jagadeesh Sankaran, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 950 days.

(21) Appl. No.: 11/740,428

(22) Filed: Apr. 26, 2007

(65) Prior Publication Data

US 2008/0266151 A1 Oct. 30, 2008

(51) Int. Cl.
G06K 9/36 (2006.01)
H03M 7/00 (2006.01)
G06K 9/46 (2006.01)

(52) U.S. Cl. ........................ 382/232; 341/107
(58) Field of Classification Search ................ 382/164, 382/166, 173, 232, 233, 236, 238, 239, 240, 382/243, 245–247, 250, 251, 260–264; 341/50–52, 341/59, 65, 67, 107; 375/240.23–240.25, 375/E7.129, E7.144, E7.211; 348/416
See application file for complete search history.

(56) References Cited

U.S. PATENT DOCUMENTS

| | | | |
|---|---|---|---|
| 6,646,578 B1 * | 11/2003 | Au | 341/67 |
| 6,690,307 B2 * | 2/2004 | Karczewicz | 341/67 |
| 6,825,782 B2 * | 11/2004 | Bossen | 341/107 |
| 6,894,628 B2 * | 5/2005 | Marpe et al. | 341/107 |
| 6,917,310 B2 * | 7/2005 | Pearson et al. | 341/50 |
| 6,927,710 B2 * | 8/2005 | Linzer et al. | 341/107 |
| 6,940,429 B2 * | 9/2005 | Sankaran | 341/65 |
| 6,987,888 B2 * | 1/2006 | Wang et al. | 382/236 |
| 7,079,057 B2 * | 7/2006 | Kim et al. | 341/107 |
| 7,099,387 B2 * | 8/2006 | Bjontegaard et al. | 375/240 |
| 7,177,876 B2 * | 2/2007 | Sankaran | 1/1 |
| 7,221,296 B2 * | 5/2007 | Ziauddin et al. | 341/107 |
| 7,292,165 B2 * | 11/2007 | Cha et al. | 341/107 |
| 2006/0017592 A1 | 1/2006 | Shim et al. | |
| 2008/0266151 A1 * | 10/2008 | Sankaran | 341/107 |
| 2008/0267513 A1 * | 10/2008 | Sankaran | 382/232 |

FOREIGN PATENT DOCUMENTS

| | | |
|---|---|---|
| EP | 1509044 A2 | 2/2005 |
| WO | WO 2006/123913 A1 | 1/2006 |

* cited by examiner

*Primary Examiner*—Amir Alavi
(74) *Attorney, Agent, or Firm*—Robert D. Marshall, Jr.; W. James Brady; Frederick J. Telecky, Jr.

(57) ABSTRACT

This invention decodes coefficient magnitudes in compressed video data using a selected context and speculatively decodes a coefficient sign. The next context selection depends upon a number of iterations. This invention confirms the speculatively decoded coefficient sign upon completion of the magnitude decode. This invention operates in a loop until reaching the number of significant coefficients within the block. The method exits the loop and decodes an escape code if an iteration count is greater than a predetermined number. An embodiment of this invention collects both a count up and a count down in an escape code decode in one loop. An embodiment of this invention estimates the number of significant coefficients in a block and selects the inventive or a prior art decode.

15 Claims, 11 Drawing Sheets (1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

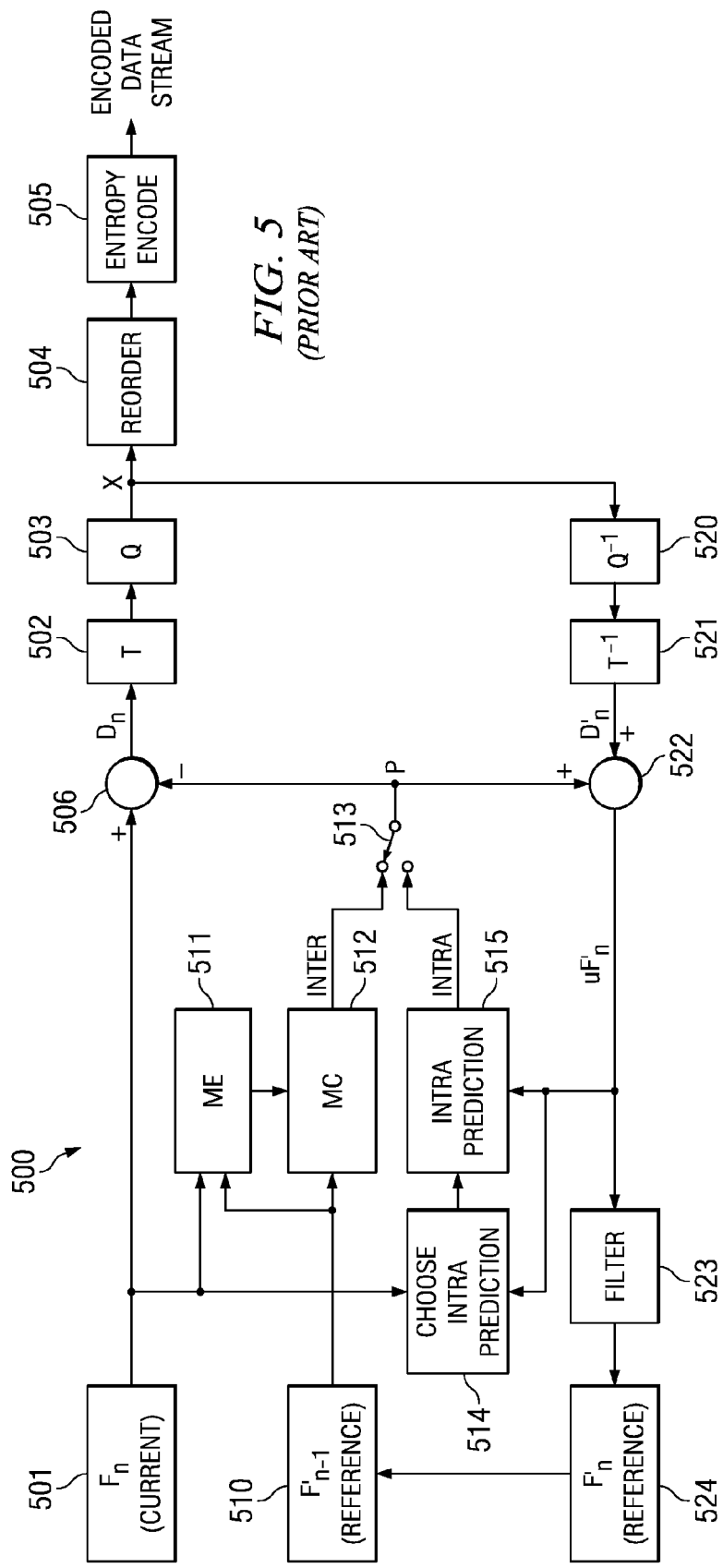

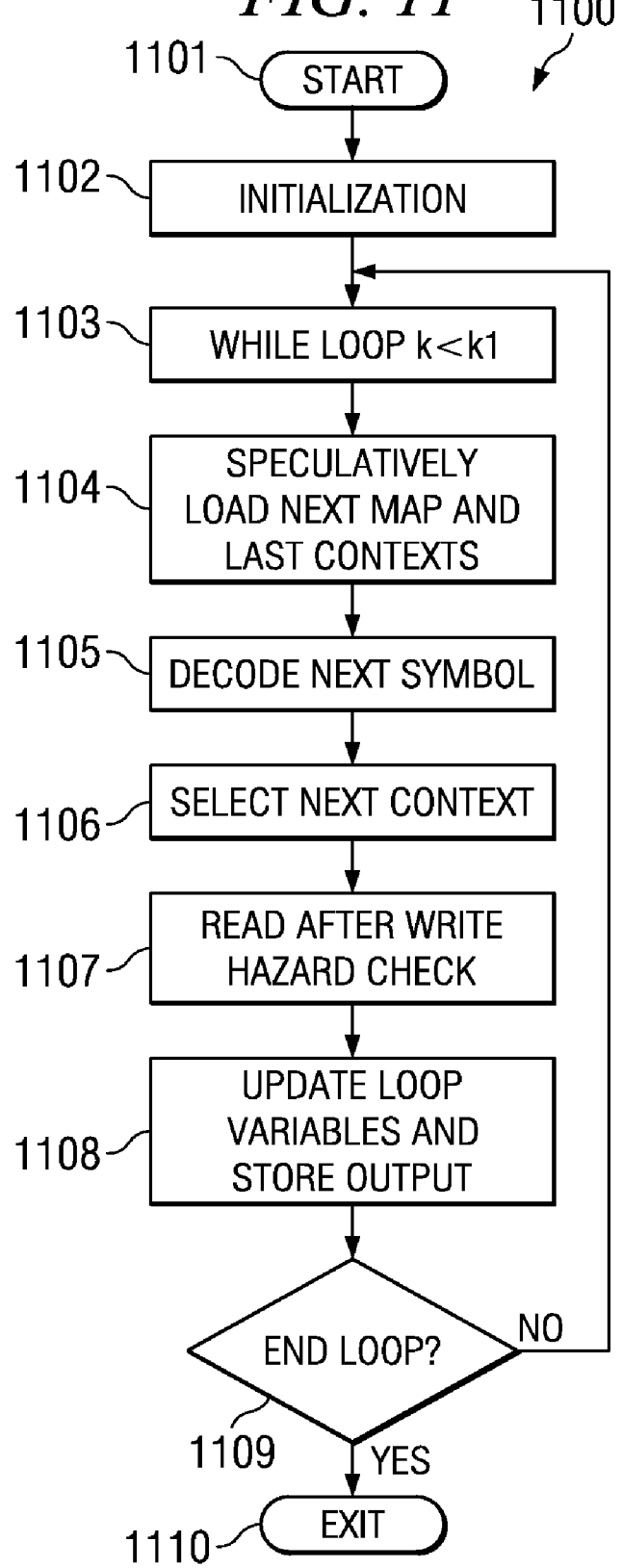

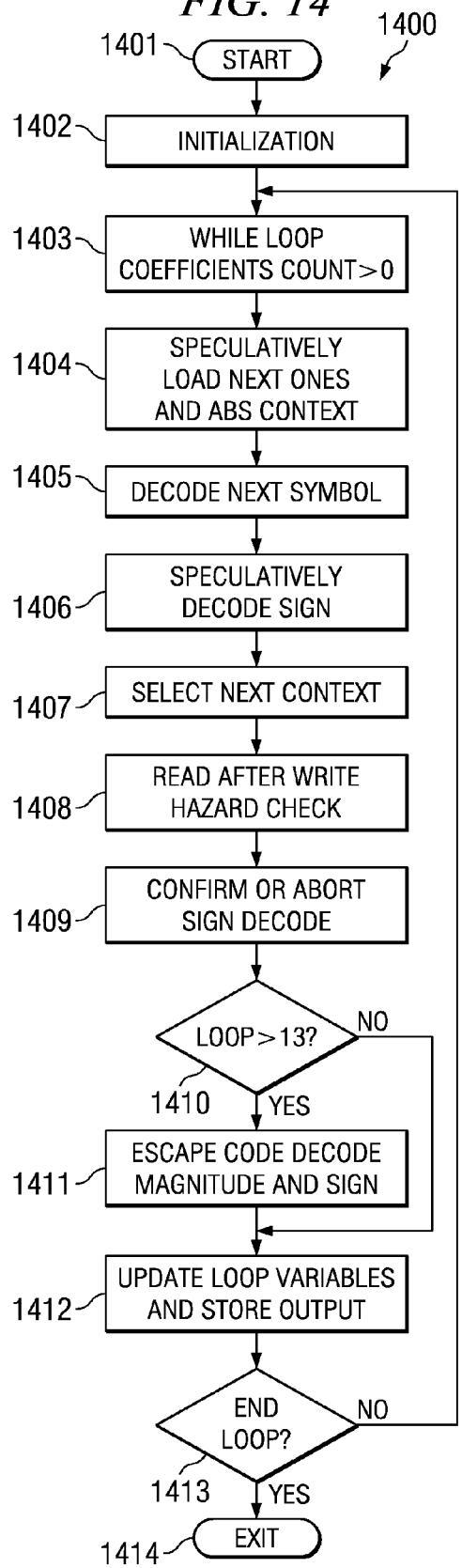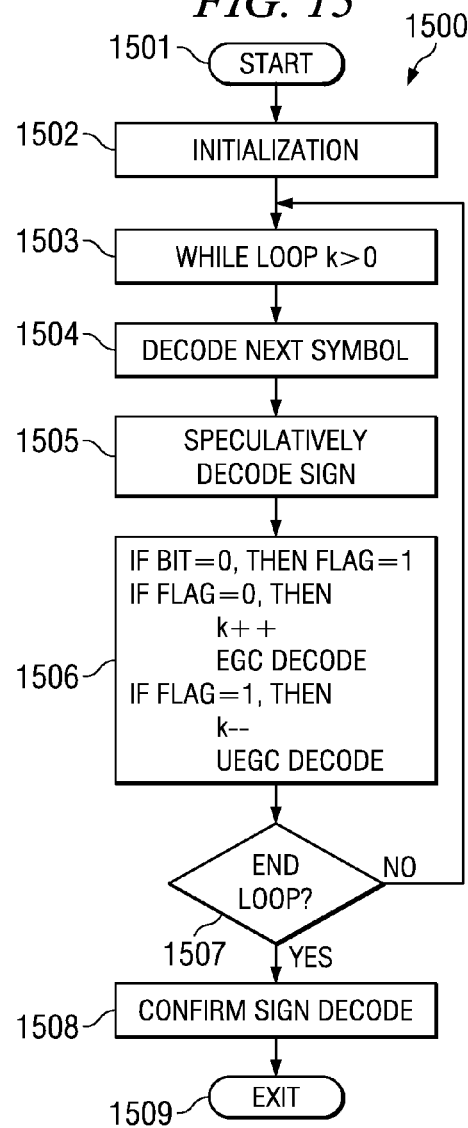

METHOD OF CABAC COEFFICIENT MAGNITUDE AND SIGN DECODING SUITABLE FOR USE ON VLIW DATA PROCESSORS

TECHNICAL FIELD OF THE INVENTION

The technical field of this invention is decoding in image transmission systems such as video conferencing and video compression, and especially Context based Adaptive Binary Arithmetic Coding (CABAC).

BACKGROUND OF THE INVENTION

New video conferencing encoding standards such as H.264 employ Context based Adaptive Binary Arithmetic Decoding (CABAC). In CABAC data is encoded based upon the relationship between the most probable next data and other data. The most probable data is encoded in fewer bits than other data. Many types of image data can be transmitted in this form. This application discloses an example of encoding of a significance map, but other data types are feasible.

Image data compression often employs a spatial to frequency transform of blocks of image data known as macroblocks. A Discrete Cosine Transform (DCT) is typically used for this spatial to frequency transform. Most images have more information in the low frequency bands than in the high frequency bands. It is typical to arrange and encode such data in frequency order from low frequency to high frequency. Generally such an arrangement of data will produce a highest frequency with significant data that is lower than the highest possible encoded frequency. This permits the data for frequencies higher than the highest frequency with significant data to be coded via an end-of-block code. Such an end-of-block code implies all remaining higher frequency data is insignificant. This technique saves coding the bits that might have been devoted to the higher frequency data.

The H.264 video conferencing standard uses significance map to perform run-level information encoding after quantization. Every coefficient that is non-significant (zero) is encoded as 0. If a coefficient is significant, that is non-zero, and it is not the last such significant coefficient in the block, then it is encoded as 10. If the coefficient is the last significant coefficient in the block, then it is encoded as 11. If the coefficient is significant and is also the last possible coefficient in the block, then it is encoded as 10. Such a coefficient would be known as the last coefficient in the block by a count of the block coefficients.

A straight forward manner of CABAC decoding such data employs a series of conditional branches. Such conditional branching code is not well matched to a pipelined data processor which experiences a pipeline hit upon each conditional branch. Each taken conditional branch requires that later instructions already partially executed within the pipeline be aborted and new instructions be processed within the pipeline. This serves to place a limit on processing speed because data processors tend to be more deeply pipelined at higher operating frequencies. Software loop unrolling may reduce this problem. In any event, conventional CABAC decoding is not well matched to exploiting instruction level parallelism of a very long instruction word (VLIW) data processor such as the Texas Instruments TMS320C6000 series.

SUMMARY OF THE INVENTION

Decoding significance map encoded using CABAC in H.264 is a computationally intensive task with a lot of serial operations. This invention is a method to advantageously perform important aspects of CABAC in a pipelined, VLIW data processor. This invention exploits additional parallelism within the same thread of computation thereby improving performance on pipelined, VLIW digital signal processors.

This invention decodes coefficient magnitude and sign data in a block of compressed video data. This invention decodes a next coefficient magnitude symbol using a selected context. This invention speculatively decodes next data as a coefficient sign. This invention then selects a next context dependent upon a number of iterations and updates an iteration count and a coefficient count dependent upon said decoded symbol. This invention confirms or aborts the speculatively decoded coefficient sign dependent upon decode of a coefficient magnitude is complete. This invention operates in a loop until a coefficient count reaches a number of significant coefficients within the block.

The invention speculatively loads a ones context and an abs context for the current index count. The current context is updated following each decoding of a significance symbol. A read after write hazard check determines if a speculatively loaded ones context or abs context has been updated. If so the method replaces the speculatively loaded context with the updated context.

The method exits the loop and decodes an escape code coefficient magnitude and sign if an iteration count is greater than a second predetermined number. Following the escape code decode, the invention re-enters the loop for a next coefficient. Decoding the escape code coefficient and magnitude includes decoding a next coefficient magnitude symbol using a selected decode technique, speculatively decoding a coefficient sign and updating loop variables. The loop variables include a flag set if the decoded next coefficient magnitude symbol is 0. If the flag is not set, the method increments a loop variable and selects a first decode technique. If the flag is set, the method decrements the loop variable and selects a second decode technique. This escape code decode loop operates until the loop variable counts down to 0. On count down to 0, the invention confirms the speculatively decoded coefficient sign.

The invention preferably uses as software unrolled loop where each iteration of a coded loop operates on more than one iteration of a logical loop. The invention speculatively loads a ones context and an abs context for said current index count for each logical loop. The current context is updated following each decoding of a significance symbol. A read after write hazard check determines if a speculatively loaded map context or last context has been updated. If so replacing the speculatively loaded context with the updated context.

This invention is optimal for busy pictures with a large number of significant coefficients in the blocks of data. Relatively quiet portions are better decoded in the prior art method. An embodiment of this invention estimates the number of significant coefficients in a block and selects the appropriate decode method. This could be based upon whether the frame is an I frame. This could be based upon the number of significant coefficients in a prior block or a history of plural prior blocks. Switching based upon a hysteresis reduces the possibility of cache thrashing.

BRIEF DESCRIPTION OF THE DRAWINGS

These and other aspects of this invention are illustrated in the drawings, in which:

FIG. 4 illustrates the instruction syntax of the very long instruction word digital signal processor core illustrated in FIG. 2 (prior art);

FIG. 5 illustrates an overview of the video encoding process of the prior art;

FIG. 11 illustrates a flow chart of significance map decoding of this invention;

FIG. 14 is a flow chart of decoding coefficient magnitudes and signs according to this invention;

FIG. 15 is a flow chart of escape code decoding of a coefficient magnitude and sign according to an alternative embodiment of this invention;

DETAILED DESCRIPTION OF PREFERRED EMBODIMENTS

Figure 1:
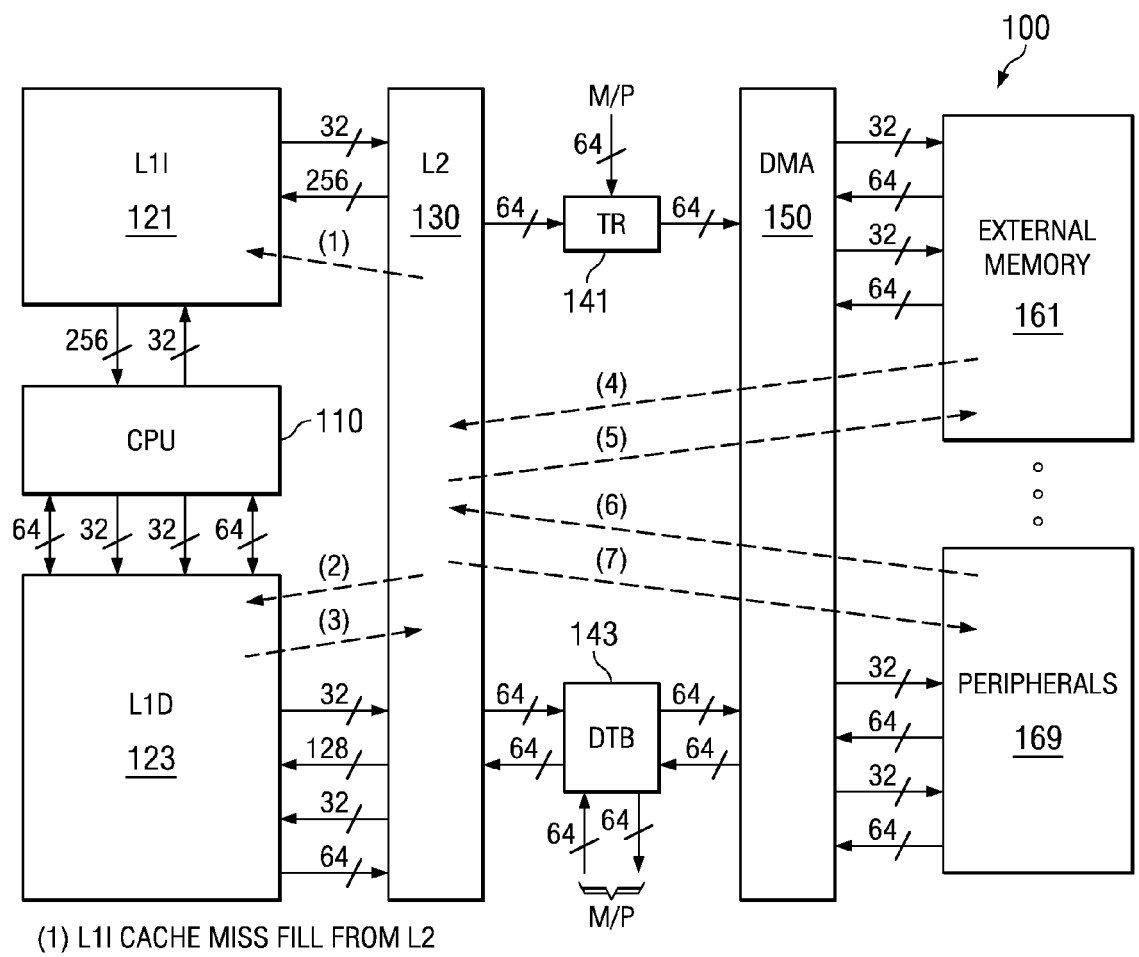
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

Figure 2:
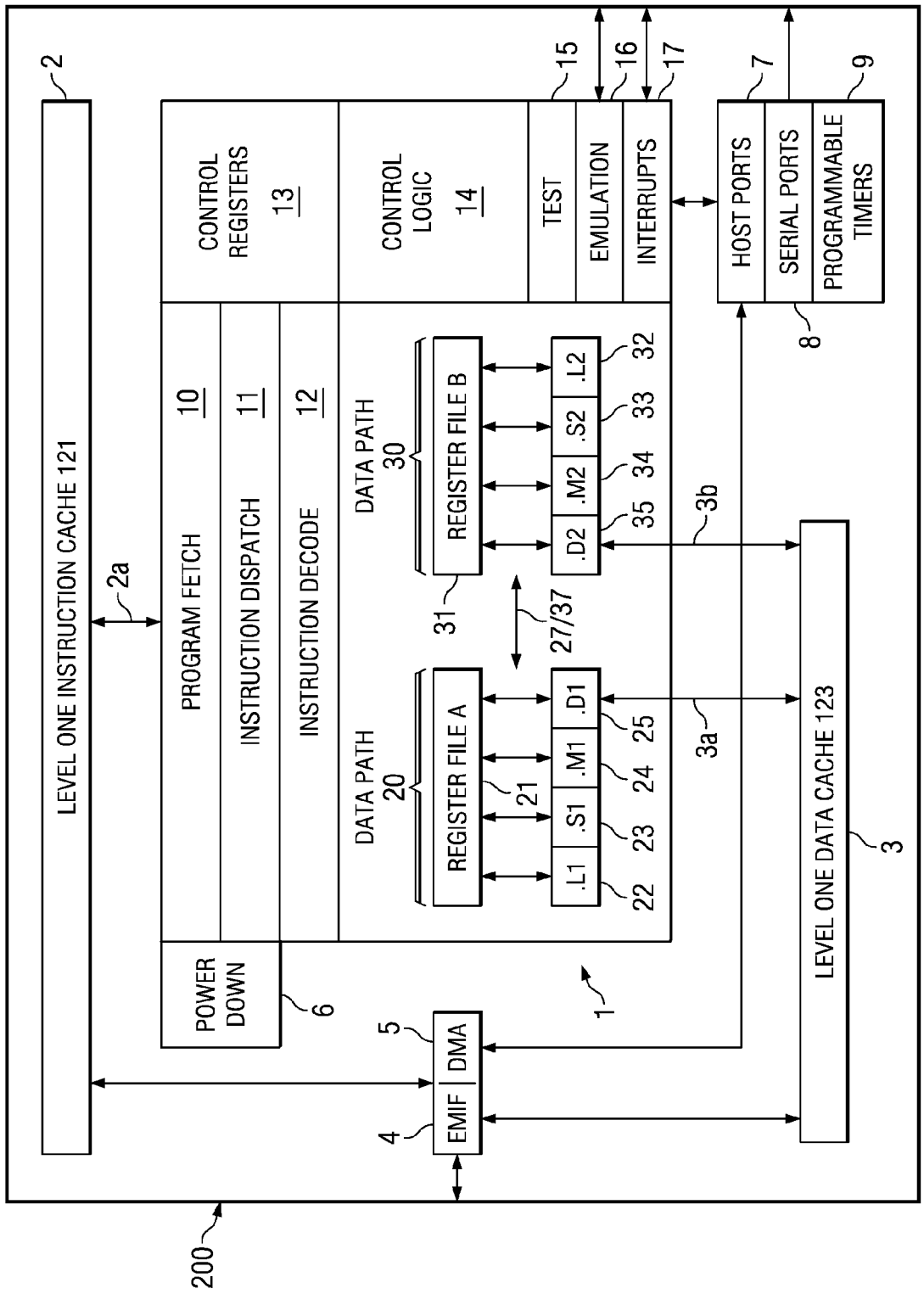
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level 1 instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs in each of the two data paths 20 and 30. As previously described above each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
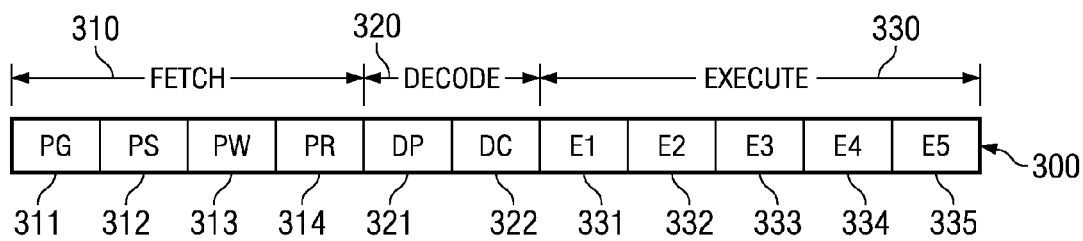
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16×16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extensions instructions, the results are written to a register file. Multiply extension instructions complete during the E4 phase 334.

During E5 phase 335, load instructions write data into a register. Load instructions complete during the E5 phase 335.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional Register | creg | | | z |
|---|---|---|---|---|
| | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 illustrates the encoding process 500 of video encoding according to the prior art. Many video encoding standards use similar processes such as represented in FIG. 5. Encoding process 500 begins with the n th frame $F_n$ 501. Frequency transform block 502 transforms a macroblock of the pixel data into the spatial frequency domain. This typically involves a discrete cosine transform (DCT). This frequency domain data is quantized in quantization block 503. This quantization typically takes into account the range of data values for the current macroblock. Thus differing macroblocks may have differing quantizations. In accordance with the H.264 standard, in the base profile the macroblock data may be arbitrarily reordered via reorder block 504. As will be explained below, this reordering is reversed upon decoding. Other video encoding standards and the H.264 main profile transmit data for the macroblocks in strict raster scan order. The quantized data is encoded by entropy encoding block 505. Entropy encoding employs fewer bits to encode more frequently used symbols and more bits to encode less frequency used symbols. This process reduces the amount of encoded that must be transmitted and/or stored. The resulting entropy encoded data is the encoded data stream. This invention concerns content based adaptive arithmetic coding (CABAC) which will be further described below.

Video encoding standards typically permit two types of predictions. In inter-frame prediction, data is compared with data from the corresponding location of another frame. In intra-frame prediction, data is compared with data from another location in the same frame.

For inter prediction, data from n−1 th frame $F_{n-1}$ 510 and data from the current frame $F_n$ 501 supply motion estimation block 511. Motion estimation block 511 determines the positions and motion vectors of moving objects within the picture. This motion data is supplied to motion compensation block 512 along with data from frame $F_{n-1}$ 510. The resulting motion compensated frame data is selected by switch 513 for application to subtraction unit 506. Subtraction unit 506 subtracts the inter prediction data from switch 513 from the input frame data from current frame $F_n$ 501. Thus frequency transform block 502, quantization block 503, reorder block 504 and entropy encoding block 505 encode the differential data rather than the original frame data. Assuming there is relatively little change from frame to frame, this differential data has a smaller magnitude than the raw frame data. Thus this can be expressed in fewer bits contributing to data compression. This is true even if motion estimation block 511 and motion compensation block 512 find no moving objects to code. If the current frame $F_n$ and the prior frame $F_{n-1}$ are identical, the subtraction unit 506 will produce a string of zeros for data. This data string can be encoded using few bits.

The second type of prediction is intra prediction. Intra prediction predicts a macroblock of the current frame from another macroblock of that frame. Inverse quantization block 520 receives the quantized data from quantization block 503 and substantially recovers the original frequency domain data. Inverse frequency transform block 521 transforms the frequency domain data from inverse quantization block 520 back to the spatial domain. This spatial domain data supplies one input of addition unit 522, whose function will be further described. Encoding process 500 includes choose intra predication unit 514 to determine whether to implement intra prediction. Choose intra prediction unit 514 receives data from current frame $F_n$ 501 and the output of addition unit 522. Choose intra prediction unit 514 signals intra prediction intra predication unit 515, which also receives the output of addition unit 522. Switch 513 selects the intra prediction output for application to the subtraction input of subtraction units 506 and an addition input of addition unit 522. Intra prediction is based upon the recovered data from inverse quantization block 520 and inverse frequency transform block 521 in order to better match the processing at decoding. If the encoding used the original frame, there might be drift between these processes resulting in growing errors.

Video encoders typically periodically transmit unpredicted frames. In such an event the predicted frame is all 0's. Subtraction unit 506 thus produces data corresponding to the current frame $F_n$ 501 data. Periodic unpredicted or I frames limits any drift between the transmitter coding and the receive decoding. In a video movie a scene change may produce such a large change between adjacent frames that differential coding provides little advantage. Video coding standards typically signal whether a frame is a predicted frame and the type of prediction in the transmitted data stream.

Encoding process 500 includes reconstruction of the frame based upon this recovered data. The output of addition unit 522 supplies deblock filter 523. Deblock filter 523 smoothes artifacts created by the block and macroblock nature of the encoding process. The result is reconstructed frame $F'_n$ 524. As shown schematically in FIG. 5, this reconstructed frame $F'_n$ 524 becomes the next reference frame $F_{n-1}$ 510.

Figure 6:
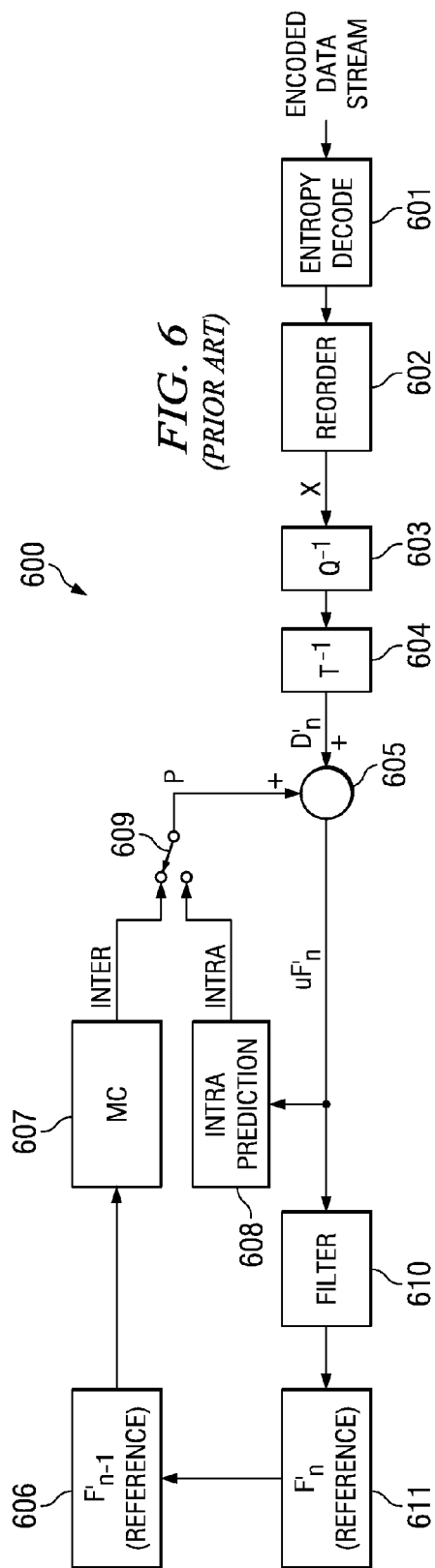
FIG. 6 illustrates an overview of the video decoding process of the prior art.

FIG. 6 illustrates the corresponding decoding process 600. Entropy decode unit 601 receives the encoded data stream. Entropy decode unit 601 recovers the symbols from the entropy encoding of entropy encoding unit 505. This invention is applicable to CABAC decoding. Reorder unit 602 assembles the macroblocks in raster scan order reversing the reordering of reorder unit 504. Inverse quantization block 603 receives the quantized data from reorder unit 602 and substantially recovers the original frequency domain data. Inverse frequency transform block 604 transforms the frequency domain data from inverse quantization block 603 back to the spatial domain. This spatial domain data supplies one input of addition unit 605. The other input of addition input 605 comes from switch 609. In inter mode switch 609 selects the output of motion compensation unit 607. Motion compensation unit 607 receives the reference frame $F'_{n-1}$ 606 and applies the motion compensation computed by motion compensation unit 512 and transmitted in the encoded data stream.

Switch 609 may also select intra prediction. The intra prediction is signaled in the encoded data stream. If this is selected, intra prediction unit 608 forms the predicted data from the output of adder 605 and then applies the intra prediction computed by intra prediction block 515 of the encoding process 500. Addition unit 605 recovers the predicted frame. As previously discussed in conjunction with encoding, it is possible to transmit an unpredicted or I frame. If the data stream signals that a received frame is an I frame, then the predicted frame supplied to addition unit 605 is all 0's.

The output of addition unit 605 supplies the input of deblock filter 610. Deblock filter 610 smoothes artifacts created by the block and macroblock nature of the encoding process. The result is reconstructed frame $F'_n$ 611. As shown schematically in FIG. 6, this reconstructed frame $F'_n$ 611 becomes the next reference frame $F_{n-1}$ 606.

The deblocking filtering of deblock filter 523 and deblock 610 must be the same. This enables the decoding process to accurately reflect the input frame $F_n$ 501 without error drift. The H.264 standard has a specific, very detailed decision matrix and corresponding filter operations for this process. The standard deblock filtering is applied to every macroblock in raster scan order. This deblock filtering smoothes artifacts created by the block and macroblock nature of the encoding. The filtered macroblock is used as the reference frame in predicted frames in both encoding and decoding. The encoding and decoding apply the identical processing the reconstructed frame to reduce the residual error after prediction.

Figure 7:
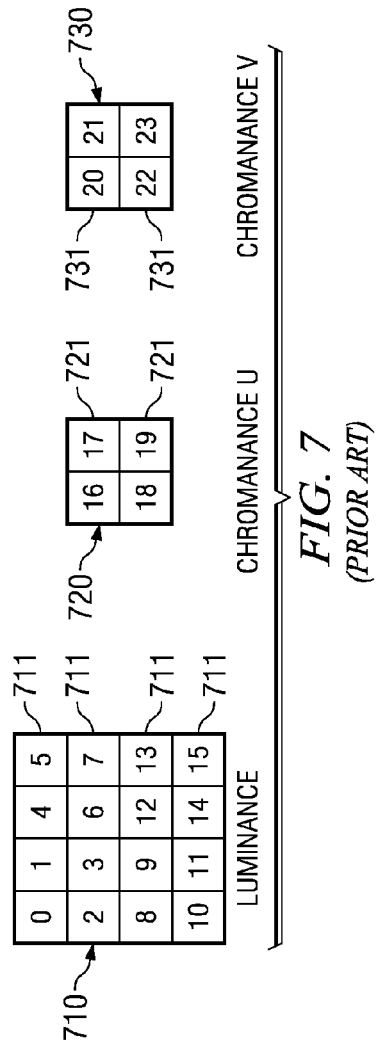
FIG. 7 illustrates division of a 16 by 16 block of luminance data into sixteen 4 by 4 sub-blocks and similar division of two 8 by 8 chrominance blocks into four each 4 by 4 sub-blocks according to the prior art.
Figure 8:
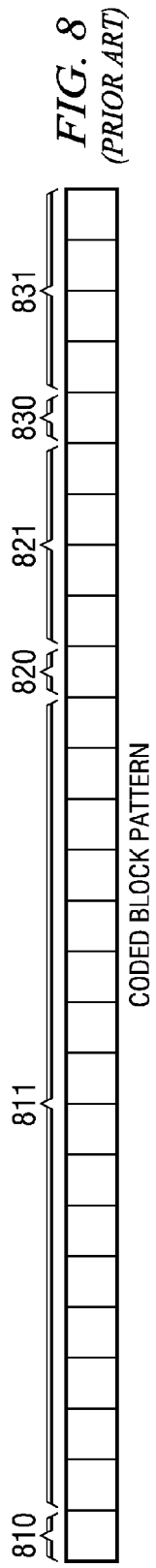
FIG. 8 illustrates the prior art coding of a coded block pattern corresponding to the block data illustrated in FIG. 7.

FIGS. 7 and 8 illustrate a typical prior art technique for compressing data in video coding. FIG. 7 illustrates a 16 by 16 block of frequency domain transformed luminance data 710 divided into sixteen 4 by 4 sub-blocks 711. These are numbered 0 to 15. FIG. 7 also illustrates corresponding chrominance data. Chrominance U data 720 is an 8 by 8 block covering the same area as luminance block 710. Human perception is more sensitive to luminance data than chrominance data, therefore it is typical to transmit chrominance data at a lower resolution. Chrominance U data 720 includes four 4 by 4 sub-blocks 721. FIG. 7 further illustrates an 8 by 8 block chrominance V data 730 formed of four 4 by 4 sub-blocks 731.

FIG. 8 illustrates a coded block pattern indicative of the status of corresponding parts of the data represented in FIG. 7. In the H.264 standard the coded block pattern is coded differently based upon the selected block type. For intra predicted 16 by 16 blocks, field 810 indicates whether the DC term of all sixteen (0 to 15) of the 4 by 4 sub-blocks in block 710 are zero. If all these DC terms are zero, then field 810 is 0. If any of these DC terms are non-zero, then field 810 is 1. For intra predicted 16 by 16 blocks, field 811 indicates whether any AC data for a corresponding sub-block 711 of luminance data 710 is zero or non-zero. In the H.264 standard the bit of field 811 is 0 if there is no non-zero AC coefficient data for the corresponding sub-block 711 and 1 if any AC coefficient is non-zero. Blocks other than intra predicted 16 by 16 blocks are coded slightly differently. For these other block types, field 810 though present includes no coded information. Thus field 810 is a don't care. For these other block types, field 811 indicates whether any data (DC or AC) for a corresponding sub-block 711 of luminance data 710 is zero or non-zero. In the H.264 standard the bit of field 811 is 0 if there is no non-zero coefficient data for the corresponding sub-block 711 and 1 if any coefficient is non-zero.

Fields 820, 821, 830 and 831 are coded the same for all block types. Field 820 is a single bit indicating whether the DC components of the whole block 720 are all zero or not all zero. Field 821 is four bits. Each bit of field 821 indicates if the AC terms of the corresponding sub-blocks 721 are all zero or not all zero. Fields 830 and 831 are similarly coded for block 730.

The coding in the coded block pattern enables data compression. The encoder 500 need not provide any data corresponding to all zero sub-blocks as indicated by the corresponding bit of the code bit pattern. The particular coding in the coded block pattern is a design choice. This coding order must be known to both the encoder 500 and the decoder 600. Note that the existence of all zero sub-blocks does not indicate that the original image is devoid of corresponding data. An all zero sub-block merely indicates that within the range coded according to the selected quantization, the image data matches the prediction data.

The encoder 500 supplies a significance map for each non-zero (significant) sub-block. This significance map indicates whether data for the corresponding coefficient in the 4 by 4 block is non-zero. In the coding technique of this example, this significance map data is CABAC encoded. This CABAC encoding includes two context map arrays, each array having a context corresponding to a position of the corresponding coefficient. In this example, entropy encoding block 505 encodes a 0 if the corresponding coefficient in the 4 by 4 sub-block is zero. If the corresponding coefficient in the 4 by 4 sub-block is not zero, entropy encoding block 505 uses two bits for encoding. The first bit is always 1. The second bit is 0 if the corresponding non-zero coefficient is not the last non-zero coefficient in the 4 by 4 sub-block. The second bit is 1 if the corresponding non-zero coefficient is the last non-zero coefficient in the 4 by 4 sub-block. If the last possible coefficient in the 4 by 4 block is non-zero (end of sub-block), it is coded as 10. This coding is shown in Table 2.

TABLE 2

| Encoded Bits | Meaning |
| --- | --- |
| 0 | Coefficient zero |
| 10 | Coefficient non-zero and not last non-zero coefficient, or non-zero and end of sub-block |
| 11 | Coefficient non-zero and last non-zero coefficient |

This coding provides compression because no data is encoded for a coefficient with a magnitude that the significance map indicates is zero. The end of sub-block code 11 permits all final zero coefficients to be omitted. The significance map enables the following significant coefficient magnitude data to be recognized and decoded without having to transmit non-significant data.

The prior art manner to decode this significance map is to decode one bit at a time using the corresponding context. This is a very serial process. This prior art method fails to effectively utilize the parallel processing capability of the digital signal processing core described in conjunction with FIGS. 1 to 4. The prior art technique does not exploit parallelism in the coding and thus typically wastes the capacity of the eight functional units 22, 23, 24, 25 32, 33, 34 and 35. In addition, the serial decoding process of this prior art method makes the long pipeline illustrated in FIG. 4 disadvantageous. Each conditional branch operation of the prior art method breaks the sequential chain of instructions. Thus several fetched and partially decoded instructions must be abandoned for each taken conditional branch. The result is ineffective utilization of the digital signal processor integrated circuit 200.

Figure 9:
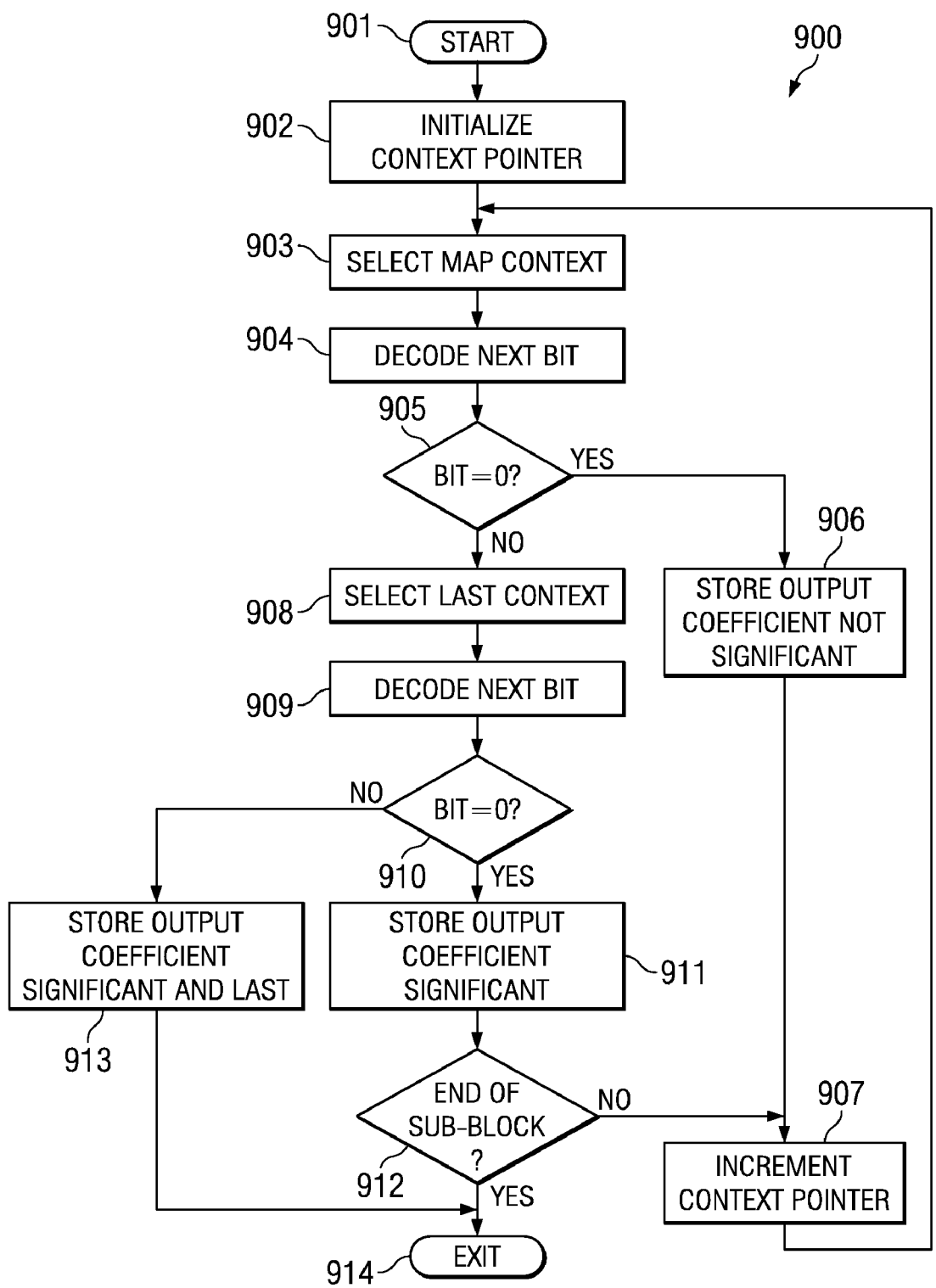
FIG. 9 illustrates the process of decoding a significance map according to the prior art.

FIG. 9 illustrates this prior art decoding process. Process 900 begins with start block 901. Block 902 initializes the context pointer. As explained below, significance map decoding typically uses two sets of contexts, a map context and a last context. There is a separate context for each element in the significance map to be decoded. In this H.264 example, there are fifteen or sixteen such contexts. For intra predicted luminance blocks and the two chrominance blocks, the DC frequency domain term is separately coded from the AC frequency domain terms. For the luminance data in non-intra predicted blocks, each sub-block included sixteen coefficients. For all other sub-blocks (luminance data of sub-blocks in intra predicted blocks and the two chrominance sub-blocks), each sub-block included fifteen coefficients. Those skilled in the art would recognize that other numbers of coefficients are possible depending upon the coding technique.

Process 903 selects the map context corresponding to the current context pointer value in block 903. For the first iteration of this loop, the initialization of block 902 selects the map context for the first entry of the significance map. Note that the H.264 standard uses two arrays of contexts for decoding the significance map. As will be described below a map context and a last context are provided for each element of the significance map. The current context pointer selects the applicable context within either the map context array or the last context array for decoding the next bit.

Block 904 decodes the next bit of the significance map data. In the H.264 standard, this decoding is according to the context adaptive binary arithmetic coding. In the preferred embodiment of this invention, decoding this bit includes the decoupled range re-normalization and bit insertion of U.S. Pat. No. 6,940,429 and the speculative load and fine index selection of U.S. Pat. No. 7,177,876. These techniques convert conditional branch operations of the previous art to conditional execution, thereby improving performance on a VLIW data processor such as described in conjunction with FIGS. 1 to 4. Block 904 includes updating the corresponding map context in accordance with the CABAC technique.

Test block 905 determines if the decoded bit is zero. If the decoded bit was 0 (Yes at test block 905), then block 906 stores an output. This output indicates that the significance map marked the coefficient magnitude as zero. Such a coefficient magnitude occurs if the error between the actual data and the predicted data is less than the minimum quantization amount. In accordance with the H.264 standard, such a non-significant coefficient is not transmitted in the data stream. The decoder supplies all 0's for this coefficient upon detection of this condition. Block 907 increments the context pointer. This causes the following block 903 to select the map context for the next element in the significance map.

If the decoded bit was one (No at test block 905), then block 908 selects the last context indicated by the current context index. Decoding a one in block 904 indicates the coefficient magnitude is significant and may signal the last significant coefficient magnitude. See the entries for 10 and 11 in Table 2. Block 909 decodes this next bit using the selected last context. As previously discussed regarding block 904, block 909 includes updating the selected last context as required by the CABAC coding.

Test block 910 determines if the decoded bit is zero. If the decoded bit was 0 (Yes at test block 910), then block 911 stores an output. This output indicates that the significance map marked the coefficient magnitude as non-zero. The decoder must decode the corresponding data in the data stream to determine the coefficient magnitude. Block 912 determines if the current coefficient is the end of the sub-block. Recall that a significant coefficient magnitude for the end of sub-block is coded 10 (see Table 2). If this is not the end of the sub-block (No at test block 921), then flow proceeds to block 907 to increment the context pointer and then to block 903 to select the map context for the next element in the significance map. If this is the end of the sub-block (Yes at test block 921), then flow proceeds to exit block 914. Decoding the significance map for the sub-block is complete.

If the decoded bit was 1 (No at test block 910), then block 913 stores an output. This output indicates that the significance map marked the coefficient magnitude as non-zero. The decoder must decode the corresponding data in the data stream to determine the coefficient magnitude. This output further zero fills the significance map elements for following elements to the end of the sub-block. A coding of 11 for this significance map element indicates that the magnitude of the corresponding coefficient is significant and the magnitudes of all remaining coefficients in the sub-block are non-significant. This is indicated to inform the decoder to supply all 0's for these coefficient upon detection of this condition. Decoding the significance map for the sub-block is complete and exits via exit block 914.

Figure 10:
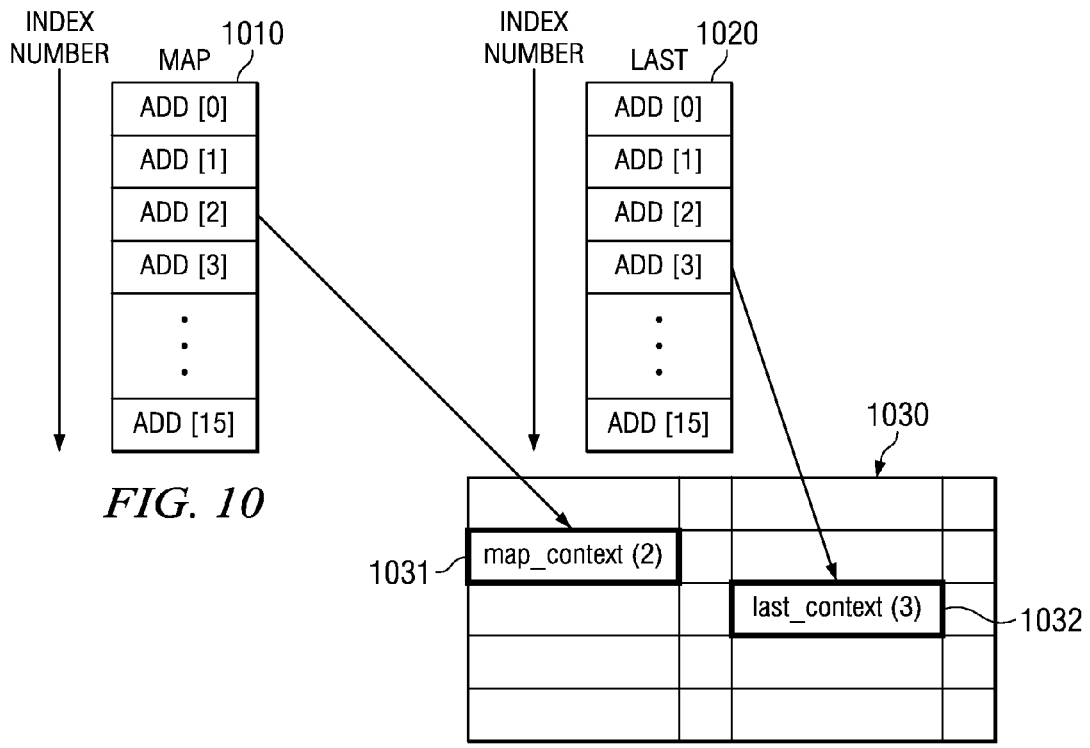
FIG. 10 illustrates a data structure used in the significance map decoding of this invention.

FIG. 10 illustrates a data structure used in the significance map decoding of this invention. The reason for adopting this data structure will be explained below. The encoding standard specifies an array of map contexts and an array of last contexts for each block type. FIG. 10 illustrates the data structure for these arrays for a single block type. FIG. 10 illustrates a one dimensional array 1010 of addresses for the map contexts. FIG. 10 also illustrates a similar one dimensional array 1020 of addresses for the last contexts. These arrays 1010 and 1020 may be part respective two dimensional arrays, with the second dimension based upon block type. Each element in map context address array 1010 stores an address within memory 1030 storing the corresponding map context. FIG. 10 illustrates element Add[2] of map context address array 1010 pointing to memory location 1031 storing map_context(2). Each element in last context address array 1020 stores an address within memory 1030 storing the corresponding map context such as Add[3] of last context address array 1020 pointing to memory location 1032 storing last_context(3).

A element index within the decoding loop of this invention selects one element within the map context address array 1010 and one element within last context address array 1020. The address stored at this array element then points to a location within memory 1030 storing the corresponding map or last context. In accordance with the CABAC technique, these contexts are updated following each decode. The updated context is stored in the memory location pointed to by the indexed array address. It is known in the art that the same context may be used for plural elements in the encoded array. In such an event, the addresses stored in the corresponding elements of map context address array 1010 or last context address array 1020 would be equal. Thus the context at the repeated address would be shared between the corresponding indices. This invention uses this array access technique to avoid a read-after-write hazard. This will be further detailed below.

Decoding the significance map of an encoded sub-block produces a significance map array having an element for each element in the encoded sub-block. The significance map element is 0 for sub-block coefficients coded as non-significant. The significance map element is 1 for sub-block coefficients coded as significant. A later coefficient magnitude decode step will replace the array elements having a 1 with a decoded coefficient magnitude and sign. This produces an array having data corresponding to the frequency transformed data of the corresponding image sub-block.

FIG. 11 is a flow chart of the significance map decoding of this invention. Process 1100 starts at start block 1101. Before beginning the main loop, block 1102 initializes numerous variables. These variables are listed in Table 3.

TABLE 3

| Variable Name | Quantity | Initial Value |
|---|---|---|
| k | coefficient loop counter, sub-block coefficient position | 0 |
| k1 | maximum coefficient count for block type | 15 or 16 depending on block type |
| sig | current decoded significance bit | 0 |
| sig_old | last decoded significance bit | 0 |
| p | speculative load index | 0 |
| curr_ctx | indicates current context map or last | map[0] |
| coeff[0:15] | coefficient array | all 0 |
| coeff_loc | coefficient location array | all 0 |
| coeff_ctr | number of significant coefficients found | 0 |

Block 1102 also initializes pointers to map context address array 1010 and last context address array 1020 as determined by the particular block type. It is known in the art that the context arrays differ for different block types.

Block 1103 begins a WHILE loop. This WHILE loop continues for as long as the current coefficient loop count k (corresponding to the sub-block coefficient location) is less than the maximum number of coefficients for that block type. This maximum coefficient number k1 was pre-loaded in initialization block 1102.

The first operation of the WHILE loop block 1104 speculatively loads the next map and last contexts. This is a load from map[p+1] and last[p]. That is the map context for the next coefficient bin, which will be used if the current significance map bit decoding results in a 0. This 0 could be a single 0 indicating a non-significant coefficient of could be the end of an 10 pair indicating a significant coefficient that is not the last significant coefficient. The last context is for the same coefficient bin as the current significance map decoding. This will be used if the current significance map decoding results in a 1. Regardless of whether this 1 is a part of a 10 pair or of a 11 pair, another decoding with the last context of the current coefficient bin is required. This speculative read may result in a read after write (RAW) hazard which will be further described below.

Block 1105 decodes the next symbol in the significance map. This decoding preferably employs the techniques decoupling range re-normalization and bit insertion of U.S. Pat. No. 6,940,429 and speculative loading and fine index selection of U.S. Pat. No. 7,177,876 described above in conjunction with block 904. The result of this decoding is a bit stored in a variable sig and an updated context. In accordance with the CABAC technique, this updated context is stored in the memory location selected by the currently selected element in map context address array 1010 or the currently selected element in last context address array 1020.

Block 1106 selects the next context between the two speculatively loaded contexts map[p+1] and last[p]. If sig is 0, whether indicating a non-significant coefficient via a 0 significance map entry or indicating a significant coefficient not the last significant coefficient via a 10 significance map entry, then block 1106 selects the speculatively loaded map context. If sig is 1, whether the first bit of a 10 pair indicating a significant coefficient not the last significant coefficient or the first bit of a 11 pair indicating a significant coefficient that is the last significant coefficient, then block 1106 selects the speculatively loaded last context. This selection is preferably made via a conditional operation. This can be expressed in C code as follows:

if (!sig) curr_ctx=next_map_ctx
   if (sig) curr_ctx=next_last_ctx where: curr_ctx is the current context; next_map_ctx is the speculatively loaded map context at bin p+1; and next_last_ctx is the speculatively loaded last context at bin p. In assembly code for the digital signal processor described in conjunction with FIGS. 1 to 4, this selection is preferably made by predicated register move instructions. The value of sig is stored in a register capable of being a predication register. A register storing the current context is the destination register. Each instruction uses a source register where the corresponding next context is stored. As shown above in the C code example, two register moves are predicated on the value of sig in opposite senses using the z bit. This is expressed in assembly code as follows:

[!A0] MV .L1 A5, A4
   ||[A0] MV .D1 A6, A4 where: A0 is the predicate register, with the ! symbol indicating the sense of the z bit; MV is the assembly code mnemonic for a register to register move instruction; .L1 and .D1 are respective functional units 22 and 25 selected in this example; A4 is the destination register for storing the current context; A5 and A6 are the respective source registers for map and last contexts; and the symbol "||" indicates a parallel operation, that is, these instructions execute simultaneously. In the digital signal processor integrated circuit 200, such instructions can be scheduled in parallel during the same execution cycle because they do not interfere. The opposite predication means that only one instruction will complete a write to the destination register A4.

Block 1107 corrects a possible read after write (RAW) hazard in the context selection. The context specification may call for the context for one bin of the significance map to be used for another bin of the significance map. A conflict will most often occur for a 0 decoded significance bit followed by another 0 decoded significance bit. In this case the first decoded significance bit provides an update of the map context. This context update is written into the location in memory 1031 pointed to the by index selected address in map context address array 1010. The speculative read of the next map context occurs before this update is computed and stored in memory. This situation is called a RAW hazard because the data read occurs before the updated data write. This invention prevents this hazard. This invention compares the read address of the speculatively loaded map context with write address of the context being updated. These addresses are both stored in map context address array 1010. If these addresses are not equal, then the context is not being reused. Thus the speculatively loaded context is correct. If these addresses are equal, then the context is being reused. Thus the updated context being written to memory is correct. This test and substitution can be made by a predicated register to register move instruction. The addresses are compared or subtracted, with the result stored in a predication register. A predicated register to register move instruction overwrites the speculatively loaded context with the currently updating context if the predication register is 0, indicating equal addresses. If the predication register is not 0, the register to register move aborts. This process bypasses the write to memory and provides the updated context directly from the newly updated result.

Figure 12:
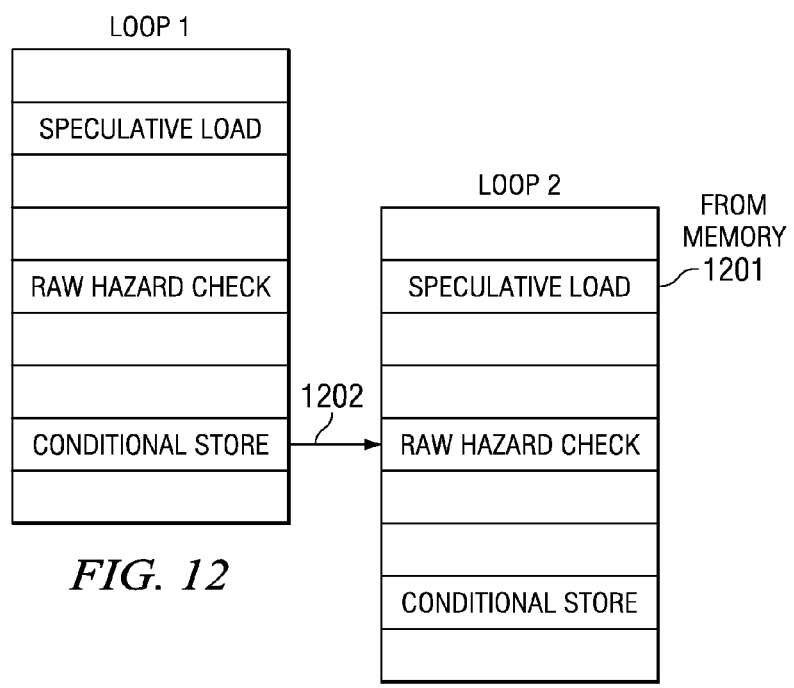
FIG. 12 illustrates an example of the significance map decoding of this invention in an unrolled loop.

This RAW hazard avoidance is most useful in unrolled loops. In software unrolled loops the actual code loop includes more than one iteration of the logical loop. Such unrolled loops are often used to permit better scheduling of operations. FIG. 12 illustrates the case of an unrolled loop including loop 1 and loop 2. The beginning of loop 2 is offset from the beginning of loop 1 to enable proper data transfer from loop 1 to loop 2 but their operations are interleaved. The speculative context load from memory 1201 in loop 2 occurs before the update context store in the conditional store operation (step 1108 further described below). The RAW hazard avoidance accepts either the context speculatively loaded from memory 1201 or the updated context being written to memory 1202 in the manner described. Note that the write of the updated context to memory is unconditional and occurs whether the addresses match or not.

A RAW hazard is less likely to occur in the last context. The standard does not permit sequential access of last contexts. At least one map context must be used between each last context use. The closest two last context uses can be is the case of two significance bins being 10 1x. The last context used to decode the 0 is not used to decode the following 1. Only after decoding the second 1 using a map context would the last context be used again. In many instances, this additional loop iteration would prevent the RAW hazard. If the actual loop includes three or more logical iterations, then a RAW hazard is possible in the last context. The RAW hazard avoidance for the last context is the same as for the map context. The address of the speculatively loaded next last context is compared with the address of the currently updating context. If they are unequal, there is not hazard and the speculatively loaded last context is valid. If they are equal, a predicated register to register move instruction from the register source of the context update overwrites the speculatively loaded last context. It is considered prudent to perform this RAW hazard for both map and last contexts whether the loop structure appears to prevent such a hazard.

Block 1108 updates loop variables and stores the output. This update and output depends upon both the current data sig and the immediately prior data sig_old. This process preferably employs a set of conditional operations as follows:

If sig_old=0, then store sig in the coefficient array coeff [k] at the current coefficient loop count k and add sig to the coefficient counter coeff_ctr;

If sig=1, then store the current coefficient loop count k in the corresponding element of the coefficient location array coeff_loc;

If sig=0, then increment the current coefficient loop count k;

If sig=1 and sig_old=1, then set current coefficient loop count k equal to maximum coefficient count k1+1; and Set sig_old equal to sig.

Test block 1109 checks the end of loop condition that the current coefficient loop count k is no longer less than the maximum coefficient count k1. This loop end condition can be satisfied by two occurrences. First, the significance map decode can decode significance for all the coefficients within the sub-block. This would occur only if the last coefficient is significant. Second, the significance map decode can detect a last significant coefficient for the sub-block marked by a 11 code. As noted above, detection of both sig=1 and sig_old=1 sets the current loop count k equal to the maximum loop count k1+1. This satisfies the end of loop condition in test block 1109. If the end of loop condition is not satisfied (No at test block 1109), then the loop returns to block 1103 for at least one more iteration. If the end of loop condition is satisfied (Yes at test block 1109), then all the significance map for the current sub-block have been decoded. Process 1100 ends at exit block 1110.

Exit block 1110 includes some additional clean up if the loop exited based upon the coefficient loop count k reaching the maximum number of coefficients k1. This occurs if the final coefficient is significant and the thus coded as 10. In this case a 1 is stored in the coefficient array coeff [k] at the current coefficient loop count k, the coefficient counter coeff_ctr is incremented and the current coefficient loop count k is stored in the corresponding coefficient array element coeff_loc. These clean up operations are needed because detection of a last significant coefficient does not provide an additional loop to store these conditions. Note that initially storing 0 in all locations of coefficient array coeff [k] means that there is no need to zero fill any remaining coefficient bins upon early exit from the WHILE loop upon detection of a 11 significance symbol.

Completion of process 1100 results in the following output. The coefficient array coeff [k] stores a 0 at each location corresponding to a non-significant coefficient and a 1 at each location corresponding to a significant coefficient. This array data will be used later in the decode process. The coefficient count coeff_ctr stores the number of significant coefficients in the just considered sub-block. Lastly, the coefficient location array coeff_loc stores a list of the significant coefficient locations.

The technique illustrated in FIG. 11 is advantageous by avoiding conditional branch instructions. The WHILE loop exit conditions can be coded to repeat the loop via an unconditional branch instruction. Since this unconditional branch instruction does not depend upon data calculated at run time, the branch would not result in a pipeline hit for each iteration. The only conditional branch instruction would be the exit from the WHILE loop. This occurs only once per sub-block. In contrast the prior art technique illustrated in FIG. 9 includes at least one conditional branch instruction for each bit decoded. This prior art technique thus produces many more pipeline hits than the present invention. These numerous pipeline hits result in slower operation for sub-blocks with many significant coefficients.

In the H.264 standard each sub-block is transmitted as a unit. This includes transmission of the significance map and then transmission of the corresponding significant coefficient magnitudes and signs. This invention would be further advantageous if more significance data were transmitted before transmission of coefficient magnitude and sign data. It is feasible to transmit the significance maps for all sixteen of the 4 by 4 sub-blocks of a 16 by 16 luminance block 710, the four 4 by 4 sub-blocks of the corresponding 8 by 8 chrominance U block 720 and the four 4 by 4 sub-blocks of the corresponding 8 by 8 chrominance V block 730 before transmission of any coefficient magnitude and sign data. Using this transmission method and with proper data organization, this invention enables decoding of all significant maps of all twenty-four sub-blocks in a single WHILE loop. This invention would thus be further advantageous when used with this alternative transmission technique.

Figure 13:
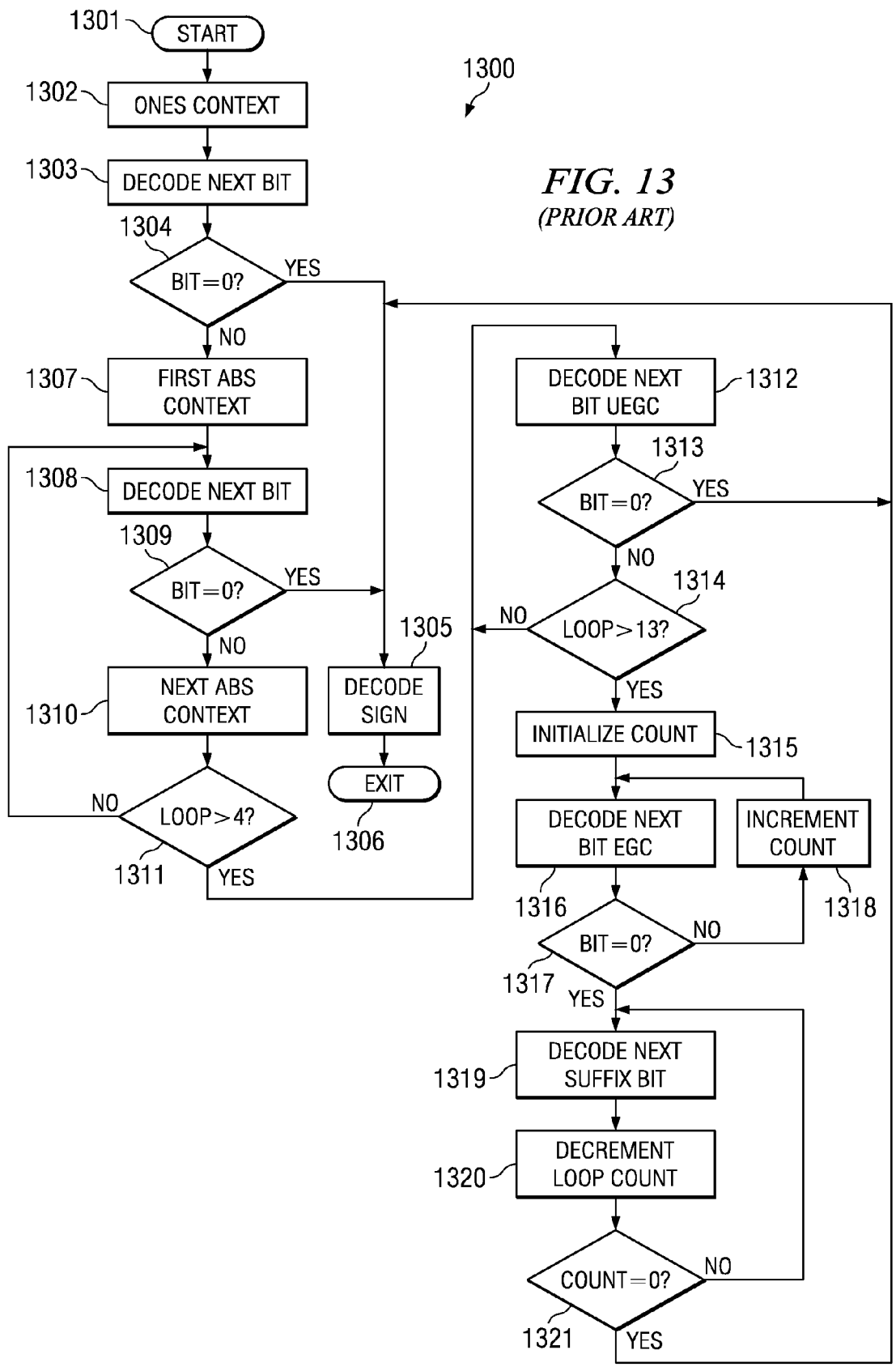
FIG. 13 illustrates a flow chart of the method of decoding coefficient magnitudes according to the prior art.

Decoding the significance map is an intermediate step in decoding data for a particular block. The significance map indicates how to interpret the following data. The significance map determines which data corresponds to which location within the frequency domain coefficients. These coefficient magnitudes are also coded and must therefore be decoded to be used. FIG. 13 illustrates a prior art method of decoding coefficient magnitudes according to the H.264 standard. Coefficient magnitudes are encoded differently than the previously described encoding of the significant map. Coefficient magnitudes are encoded in three layers. The coefficient magnitudes are encoded in differing variations of context based adaptive binary arithmetic decoding (CABAC). The first four bits of the encoded coefficient magnitude are CABAC encoded using two sets of contexts. Intermediate length data is encoded in unary exponential golomb coding. This coding technique does not require contexts for decoding. Very long coefficients are encoded in an escape code format using an exponential golomb decoding format for coefficients longer than 13 bits. Each coefficient includes both a magnitude and a sign. In the H.264 standard the signs are separately encoded using a different method called binary equal probability coding.

FIG. 13 illustrates a prior art method 1300 of decoding coefficient magnitudes according to the H.264 standard. Method 1300 decodes one coefficient magnitude and the corresponding coefficient sign. The prior art requires an outer loop not illustrated in FIG. 13 to traverse the significance map for a particular block. In the prior art, this outer loop reads sequential bins of the significance map in the order of coefficient transmission. The H.264 transmits the coefficient magnitudes and signs in a reverse zig-zag order. If the significance map bit for a particular coefficient is 0, then the outer loop does not perform method 1300. Instead this outer loop increments to the next coefficient in the significance map in the predefined transmission order. If the significance map bit is 1, then the outer loop calls method 1300 to decode the magnitude and sign of this significant coefficient. FIG. 13 does not show the required context updates for clarity.

Method 1300 begins at start block 1301. Method 1300 begins using the ones context (block 1302). Method 1300 decodes the next bit using this ones context (block 1303). Test block 1304 determines if this decoded bit is zero. If this bit is zero (Yes at test block 1304), then the coefficient magnitude has been completely decoded. Method 1300 then decodes the coefficient sign at block 1305 and ends at exit block 1306. If this bit is not 0 (No at test block 1304), then method 1300 loads the first abs context in block 1307. Method 1300 decodes the next bit using the current abs context (block 1308).

Test block 1309 determines if this decoded bit is zero. If this bit is zero (Yes at test block 1309), then the coefficient magnitude has been completely decoded. Method 1300 then decodes the coefficient sign at block 1305 and ends at exit block 1306. If this bit is not 0 (No at test block 1309), then method 1300 loads the next abs context in block 1310. Test block 1311 determines whether this loop has been traversed more than four times. If not (No at text block 1311), then method 1300 loops back to block 1308 to decode the next bit with the then current abs context. If so (Yes at text block 1311), then method 1300 changes to a different mode of decoding called unary exponential golomb decoding.

Block 1312 decodes the next bit using unary exponential golomb coding (UECG). Test block 1313 determines whether the decoded bit is zero. If this bit is zero (Yes at test block 1313), then the coefficient magnitude has been completely decoded. Method 1300 decodes the coefficient sign at block 1305 and ends at exit block 1306. If this bit is not 0 (No at test block 1313), then test block 1314 determines if method 1300 has looped for more than 13 times. If not (No at test block 1314), then method 1300 returns to block 1312 to repeat for the next decoded bit. Based upon the test in block 1314, this loop repeats a maximum of 13 iterations.

Upon reaching 13 iterations (Yes at test block 1314), then method 1300 enters the escape mode. The escape mode is rarely used and only applies to very long coefficients. Block 1315 initializes a count. This count is used to determine the length of a suffix as will be explained further. Block 1316 decodes the next bit using an exponential golomb coding (EGC). Test block 1317 determines if the decoded bit is zero. If the decoded bit is not zero (No at test block 1317), then block 1318 increments the count. Method 1300 then repeats blocks 1316 and 1317 until the exit condition of test block 1317 is satisfied.

Block 1319 decodes the next suffix bit. In the H.264 standard these suffix bits are encoded in unary exponential golomb coding. Block 1320 decrements the count. Test block 1321 determines if the count has reached zero. If the count has not reached zero (No at test block 1321), the method 1300 returns to block 1319 to decode the next suffix bit. This loop continues until the test of test block 1321 is satisfied (Yes at test block 1321). At this point the number of suffix bits equals the length of the non-zero decoded bits in the escape loop. This quantity is measured by the count variable. If the count has decremented to zero (Yes at test block 1321), coefficient magnitude decoding is complete. Method 1300 advances to block 1305 to decode the sign and the exits at exit block 1306. One pass through method 1300 decodes one coefficient (magnitude and sign) of the frequency domain data of a corresponding block.

As shown in FIG. 13, decoding the coefficient magnitudes is a very serial process including many conditional branches. This method is poorly implemented in a pipelined, very long instruction word digital signal processor such as described above and illustrated in FIGS. 1 to 4. This invention employs several techniques to improve operation on a VLIW digital signal processor. It is impossible for a single software pipelined loop to take care of all the diverse cases of coefficient magnitude coding. This invention proposes to handle all types except the escape code. Any coefficients that must be decoded using the escape code are handled by exiting the loop, doing this special decode and reentering the loop. The cases requiring escape code handling are expected to be infrequent, thus exiting the loop in these cases is believed acceptable. This invention speculatively decodes the coefficient sign for every magnitude bit decode. If the particular bit decoded to 0, then this sign decode is confirmed. If the particular bit decoded to 1, then this sign decode is incorrect and is discarded. This speculative decode followed by confirm or abort permits the inner loop to operate for the whole block rather than merely for each coefficient as in the prior art. This invention uses an array of ones contexts and abs contexts allowing the unrelated methods of decoding to coexist in the software pipelined loop. This enables longer loop operation in the steady state.

As described in conjunction with FIG. 11, the significance map decoding stores the locations of the non-zero (significant) coefficients. Thus the coefficient magnitude and sign decoding never needs to check for this. The intended result of the significance, magnitude and sign decode is an array of coefficients in the frequency domain which are zero for non-significant coefficients and non-zero for significant coefficients. This invention begins with this array and zero fills all bins. The magnitude and sign decoding then places the significant coefficients in the locations indicated by the significance map. By designing the bit management to fill up, even if the remaining bits are less than or equal to 0, there is no need to check for additional bits to perform sign decoding. This bit management guarantees at least 1 bit to perform sign decoding without performing additional checks.

FIG. 14 illustrates a flow chart of coefficient magnitude and sign decoding method 1400 of this invention. This method performs one iteration for each decoded magnitude bit of each coefficient and iterates over all significant coefficients in a block. Iterating over all significant coefficients in a block enables more efficient loop operation because the loop operates in a steady state more often. The longer loop reduces the number of times a loop prolog and a loop epilog is needed. This is particularly helpful for software unrolled loops. Such software unrolled loops are beneficial by greater use of the functional units in a VLIW processor. Combining the decode loop and the significant coefficient loop is possible because the mathematics of the decode of blocks 1303, 1308 and 1312 is essentially the same. The only mathematical difference is the selection of the context for blocks 1301 and 1308 or the selection of a decode constant in block 1312. As will be described below, method 1400 selects a next context based upon various loop variables.

Completion of significance map decode process 1100 results in the following output. The coefficient array coeff[k] stores a 0 at each location corresponding to a non-significant coefficient and a 1 at each location corresponding to a significant coefficient. The coefficient count coeff_ctr stores the number of significant coefficients in the sub-block. Lastly, the coefficient location array coeff_loc stores a list of the significant coefficient locations. This data is used in method 1400 in the coefficient magnitude and sign decode.

Method 1400 begins at start block 1401. Block 1402 initializes variables, sets the pointers to the output array and the significance map indicating significant coefficients. This initialization includes setting a coefficients count equal to coeff_ctr. As taught above, the significance map decoding of this invention produces two outputs not provided by the prior art. The first of these outputs is coeff_ctr which equals the number of significant coefficients in the current block. The second output is coeff_loc which is an array storing the locations of the significant coefficients. The array coeff_loc is used to determine the output storage location of method 1400. Note that the coeff_loc array is traversed in an order corresponding to the coefficient transmission order in the particular standard. The H.264 standard transmits the significant coefficient magnitudes and signs in reverse zig-zag order. Method 1400 employs a context read pointer to a two dimensional array of pointers for ones and abs contexts as shown in FIG. 10. This two dimensional array of pointers has as many rows as the number of block types in particular standard and as many column entries per row as the maximum number of allowed coefficients for that block type. As described below, the two dimensional array of pointers is traversed to select the proper context for a particular decode operation. Upon initialization, the context pointer points to the first ones context.

Block 1403 begins a WHILE loop. This WHILE loop continues for as long as the coefficients count is greater than 0. The coefficient count is initially set to the value of coeff_ctr and is decremented upon completion of each coefficient magnitude and sign decode. The exit condition for the WHILE loop is coefficient count equals zero.

The first operation of the WHILE loop block 1404 speculatively loads the next ones and abs contexts. That is the abs context for the next coefficient bin, which will be used if the current symbol decoding results in a 1. The ones context is for the same coefficient bin as the current coefficient decoding. This will be used if the current symbol decoding results in a 0. This speculative read may result in a read after write (RAW) hazard which will be further described below.

Block 1405 decodes the next symbol in the coefficient. This decoding preferably employs the techniques decoupling range re-normalization and bit insertion of U.S. Pat. No. 6,940,429 and speculative loading and fine index selection of U.S. Pat. No. 7,177,876 described above in conjunction with block 904. The result of this decoding is an additional bit to be stored in a variable coeff and may result in an updated abs context. In accordance with the CABAC technique, this updated context is stored in the memory location selected by the currently selected element in map context address array 1010 or the currently selected element in last context address array 1020. As will be further detailed below, this decode uses a selected context or a constant depending on the number of loops in decoding the current coefficient magnitude.

Block 1406 speculatively decodes the next bit in the data stream as if it were the coefficient sign bit. In accordance with the H.264 standard, this decode uses a binary decode symbol equal probability method. This decode will be confirmed or aborted later dependent upon the coefficient magnitude decode. This speculative sign decode enables the WHILE loop to encompass all coefficients in a block and thus run longer. In the prior art, the inner loop operates for each coefficient magnitude and sign. Thus the prior art requires more loop exits and fails to operate in the steady state as many iterations as this invention.

Block 1407 selects the next context between the two speculatively loaded ones and abs contexts. This selection is preferably made via a conditional operation similar to that described above in conjunction with block 1106 of FIG. 11. Block 1407 selects between the next ones context, the next abs context or a constant for unary exponential golomb decoding. If the just decoded bit is 0, then the next ones context is selected. If the just decoded bit is 1 and the loop count is not greater than 4, then the next abs context is selected. If the just decoded bit is 1 and the loop count is greater than 4 but less than 13, then the constant for the unary exponential golomb decode is selected. This selection is preferably made using three predicated register move instructions. These states are mutually exclusive so digital signal processor integrated circuit 200 can schedule these three instructions during the same execution cycle.

Block 1408 corrects a possible read after write (RAW) hazard in the context selection. The context specification may call for the context for one bin of the coefficient decode to be used for another bin. A conflict will most often occur because the abs context generally does not change after the fourth iteration in symbol decoding. In this case the previously decoded magnitude bit provides an update of the abs context. This context update is written into the location in memory 1031 pointed to the by index selected address in map context address array 1010. The speculative read of the next map context occurs before this update is computed and stored in memory. This situation is called a RAW hazard because the data read may occur before the updated data write in a software unrolled loop. This invention compares the read address of the speculatively loaded abs context with write address of the context being updated. If these addresses are not equal, then the context is not being reused. Thus the speculatively loaded context is correct. If these addresses are equal, then the context is being reused. Thus the updated context being written to memory is correct. This test and substitution can be made by a predicated register to register move instruction. The addresses are compared or subtracted, with the result stored in a predication register. A predicated register to register move instruction overwrites the speculatively loaded context with the currently updating context if the predication register is 0, indicating equal addresses. If the predication register is not 0, the register to register move aborts. This process bypasses the write to memory and provides the updated context directly from the newly updated result.

Block 1409 confirms or aborts the sign decode. The speculative sign decode of block 1406 is valid only if the currently decoded bit is 0. Thus if the currently decoded bit is 0, then the speculatively decoded sign is confirmed. Otherwise, this speculatively decoded sign is aborted.

Test block 1410 determines if the decoding the current coefficient has been in the WHILE loop for more that 13 iterations. This indicates that the coefficient is an escape code. If this is the case (Yes at test block 1410), then method 1400 exits the loop. Block 1411 decodes the coefficient magnitude and sign. This may be performed as described in conjunction with blocks 1315 to 1321 shown in FIG. 13 and the prior art. FIG. 15 illustrates an alternative decoding according to this invention which will be described later. The end of this escape code decode process always completes decoding the magnitude and sign of the current coefficient. Thus block 1411 sets an end of coefficient flag. This end of coefficient flag will be used in updating the loop variables and in loop exit control. Following block 1411, method 1400 reenters the loop and continues processing. If test block 1410 determines that the current coefficient decode has been the WHILE loop for no more that 13 iterations (No at test block 1410), then method 1400 continues processing.

Block 1412 updates loop variables and stores the output. The WHILE loop makes one iteration for each symbol decode of the coefficient magnitude for each significant coefficient in a block. Thus this update carries one set for counters for iterations for the same coefficient magnitude. These counters are used in the speculative context loads (block 1404), in selecting the next context (1407) and in checking the read after write hazard (block 1408). Another set of counters operates on a coefficient basis. This set of counters controls the loop exit operation (test block 1413) and in the storage location for output data.

Block 1412 includes the following operations. For each iteration the newly decoded data is accumulated with previously decoded bits. The previous value is left shifted one bit and the currently decoded bit is concatenated into the least significant bit position. If the currently decoded bit from block 1405 is 0, then decode of the current coefficient magnitude and sign is complete. The coefficient count is used with the coefficient location array coeff_loc to determine the storage location of the output data. The decoded magnitude and sign are stored in memory at a location determined by the current coefficient count and the coefficient location array coeff_loc. The loop count is reset to 1. The current context is set to the ones context. Method 1400 then decrements the coefficient count. This coefficient count is used in the end of loop determination. If the currently decoded bit is 1, then decode of the current coefficient magnitude and sign is not complete. The coefficient count is not decremented because the next pass through the loop will operate on the same coefficient. However, the loop count is incremented. As previously described this loop count is used in selecting the next context and entry into the escape code decode in block 1411.

Test block 1413 checks the end of loop condition that the current coefficient count is 0. A 0 results when the coefficient count is decremented down from its initial value of coeff_ctr detected in the significance map decode. If the end of loop condition is not satisfied (No at test block 1413), then method 1400 returns to block 1403 for at least one more iteration. If the end of loop condition is satisfied (Yes at test block 1413), then all the coefficient magnitudes and signs for the current sub-block have been decoded. Process 1400 ends at exit block 1414.

Completion of process 1400 results in the following output. The coefficient array coeff [k] stores a 0 at each location corresponding to a non-significant coefficient and the decoded magnitude and sign at each location corresponding to a significant coefficient.

FIG. 15 is a flow chart of the escape code decoding according to an alternative embodiment of this invention. Method 1500 starts at start block 1501. Before beginning the main loop, block 1502 initializes variables. One of these variables is a loop variable k initialized to 1.

Block 1503 begins a WHILE loop. This WHILE loop continues for as long as the current loop count k is greater than 0.

The first operation of the WHILE loop block 1504 decodes the next symbol in the magnitude. According to the H.264 standard this decoding employs exponential golomb coding for the initial count up loop of the binary part of the escape code (corresponding to blocks 1316, 1317 and 1318 illustrated in FIG. 13) and unary exponential golomb coding for count down loop of the non-binary part of the escape code (corresponding to blocks 1319, 1320 and 1321 illustrated in FIG. 13). These decode techniques are mathematically similar and can be performed by the same program code with selection of corresponding constants. Initialization block 1502 causes initial selection of the constant corresponding to unary exponential golomb coding. This selection is changed upon detection of a decoded 0 bit during the count up portion of the loop.

Block 1505 speculatively decodes the next bit in the data stream as if it were the coefficient sign bit. In accordance with the H.264 standard, this decode uses a binary decode symbol equal probability method. This is similar to block 1406 described above.

Block 1506 updates loop variables. A variable flag selects between count up operation and count down operation. Initialization 1502 initially sets flag to 0. If the last decoded bit is 0, then block 1506 sets flag to 1. The first decoded symbol equal to 0 occurs at the end of the binary portion of the escape coded data. This marks the end of the count up portion of the loop. Block 1506 updates loop variables based upon the state of flag. If flag is 0, then loop variable k is incremented (k++). In addition the constant for exponential golomb coding is selected for the next iteration. If flag is 1, then loop variable k is decremented (k−−). The constant for unary exponential golomb coding is selected for the next iteration. Note that flag is reset to 0 only upon loop initialization. Thus once a 0 is decoded, method 1500 switches from count up mode to count down mode and remains in count down mode until loop exit. This loop variable update enables a single loop to replace the two loops of blocks 1315 to 1321 of the prior art. Replacing two loops with one loop if advantageous to reduce the loop prolog and loop epilog iterations when operating software unrolled loops.

Test block 1507 checks the end of loop condition that k is 0. As described above, k counts up from 1 to a number determined by the length of the binary portion of the escape code, then counts down to 0. If the end of loop condition is not satisfied (No at test block 1507), then method 1500 returns to block 1503 for at least one more iteration. If the end of loop condition is satisfied (Yes at test block 1507), then the coefficient magnitude for the current escape code have been decoded. Block 1508 confirms the speculatively decoded sign of block 1505. Method 1500 ends at exit block 1509. This ends the processing of block 1411 of FIG. 14. Method 1400 proceeds with block 1412.

It is possible to combine the loops of FIGS. 14 and 15 into one unified loop. To do this block 1406 must select between the ones context, the abs context, the constant for unary exponential golomb coding, the constant for exponential golomb coding or the constant for unary exponential golomb coding depending upon the state in the decoding process. Blocks 1410, 1411 and 1412 would be subsumed into the main loop. The end of loop test of test block 1413 would include additional conditions for the escape code decoding as described above. The embodiment described in conjunction with FIGS. 14 and 15 can operate on a Texas Instruments TMS320C6400 digital signal processor. The TMS320C6400 digital signal processor does not enable a sufficient number of predicate registers to easily perform such a combined loop. Thus for this digital signal processor the embodiment using a separate subroutine for escape code decoding is preferable. However, another digital signal processor with a greater number of predicate registers could execute such a combined decoding.

Performing the decoding of this invention on a very long instruction set digital signal processor integrated circuit 200 provides greater advantages that revealed by generally linear coding implied in FIGS. 11, 14 and 15. These decoding methods provide greater access to instruction level parallelism than possible with the prior art. The capability of operating relatively independent processing simultaneously tends to enable use of a greater fraction of the eight functional units each execute cycle. For example, the symbol decode of block 1405 and the speculative sign decode of block 1406 could be substantially overlapped. Thus functional units not used for the next symbol decode (block 1405) could be profitable employed in the speculative sign decode (block 1406). The techniques of this invention including enabling loop operation over greater ranges. This greater range advantageously enhances the value of software unrolled loops.

Figure 16:
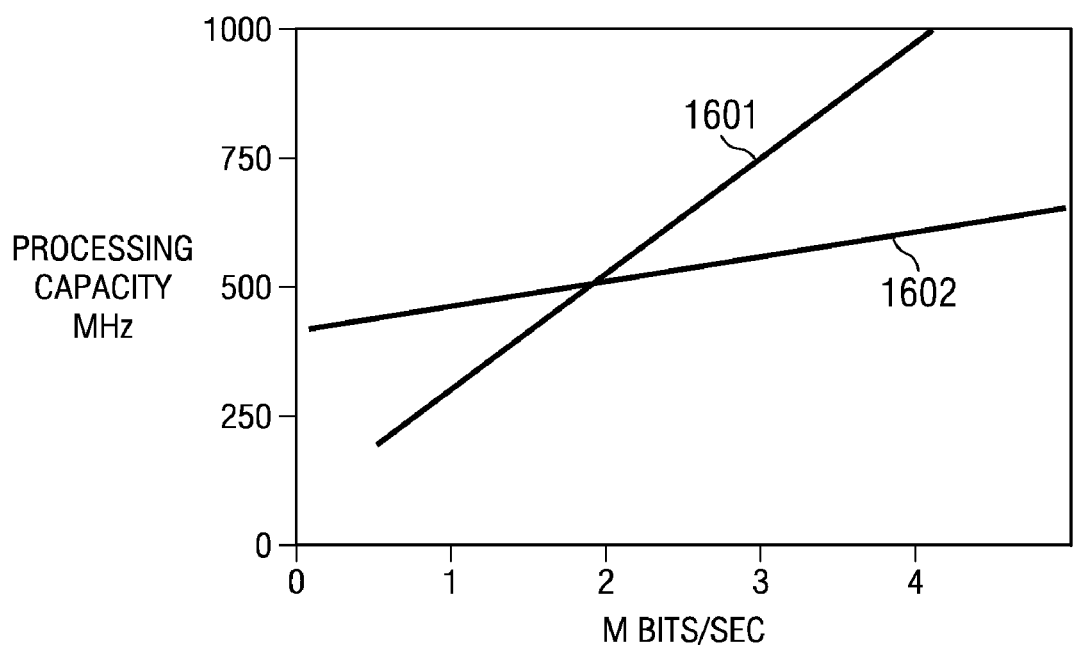
FIG. 16 illustrates an example comparison between the necessary data processing capacity versus the data transmission rate of this invention and the prior art.

FIG. 16 illustrates an example comparison between the necessary data processing capacity designated in MHz versus the data transmission rate in M bits per second. Curve 1601 illustrates the necessary data processing capacity when employing the significance map decoding technique according to FIG. 9 and the coefficient magnitude and sign decoding according to FIG. 13. Curve 1602 illustrates the necessary data processing capacity when employing the significance map decoding technique of this invention according to FIG. 11 and the coefficient and magnitude decoding technique of this invention according to FIGS. 14 and 15. At low bit rates below about 2M bits per second the prior art technique requires less computational capacity than the technique of this invention. Low data rates correspond to blocks having fewer significant coefficients than higher data rates. In this example, at low data rates with few significant coefficients per block the prior art technique is better than this invention. At higher data rates, in this example above 2M bits per second, with more significant coefficients per block this invention is better.

As clearly seen in FIG. 16, it would be advantageous to employ this invention for high data rates and the prior art technique for low data rates. This would be further advantageous if switching between techniques occurs infrequently. Such infrequent switching between decoding methods advantageously minimizes cache replacement traffic in L1 instruction cache 121, L1 data cache 123 and level two unified cache 130. Two such techniques are described below.

Figure 17:
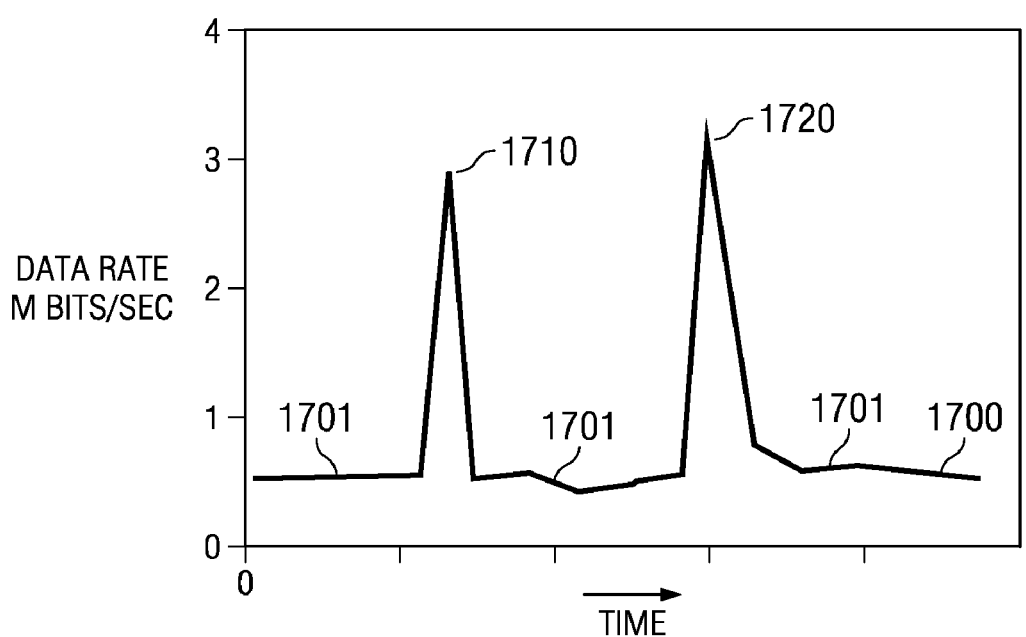
FIG. 17 illustrates a typical data rate versus time for video data encoding according to the H.264 standard.

FIG. 17 illustrates a typical data rate 1700 versus time assuming a fixed frame rate over time. During periods 1701 the data rate is relatively low on the order of 500K bits per second. However, there are regularly occurring peaks such as peaks 1710 and 1720 when the data rate approaches 3M bits per second. Analysis of typical compressed video data streams indicates that peaks 1710 and 1720 generally correspond to transmission of I frames. Such I frames involve no prediction, thus the whole coefficients are transmitted rather than differential coefficients of predicted frames. Some video sources include scene changes. Transmission of differential data upon a scene change provides little or no benefit. It is typical to transmit an unpredicted I frame upon such scene changes. Many video encoding techniques specify regular transmission of I frames. This serves to ensure that the prediction data stored in the receiver/decoder is regularly updated.

Figure 18:
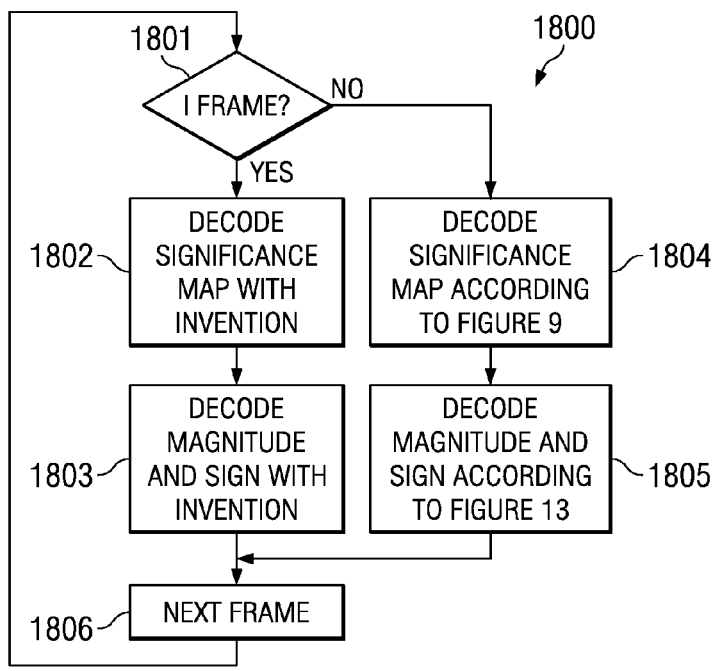
FIG. 18 illustrates a first method for selecting either the significance map decoding of this invention or of the prior art.

FIG. 18 illustrates a first method for selecting either the decoding of this invention or of the prior art. Test block 1801 in process 1800 determines if the next frame to be decoded is an I frame. If the current frame is an I frame (Yes at test block 1801), then block 1802 decodes this frame using the significance map decoding technique of this invention as illustrated in FIG. 11 and block 1803 decodes this frame using the coefficient magnitude and sign decoding technique of this invention as illustrated in FIGS. 14 and 15. If this is not an I frame (No at test block 1801), then block 1804 decodes this frame using the significance map decoding technique of the prior art as described in conjunction with FIG. 9 and block 1804 decodes this frame using the coefficient magnitude and sign decoding technique of the prior art as described in conjunction with FIG. 13. In either case, process 1800 proceeds to the next frame (block 1806) and loops back to test block 1801.

Employing this significance map decode technique of this invention only for I frames satisfies the two use criteria. First, I frames generally include many significant coefficients and thus are ideal for the significance map decoding and the coefficient magnitude and sign decoding of this invention. Second, I frames occur at intervals but are individually isolated. For each I frame there will be one program context switch to the algorithm embodying this invention. This algorithm will be used for the whole I frame. After decoding the I frame, another program context switch occurs to the algorithm embodying the significance map decoding according to FIG. 9 and the coefficient magnitude and sign decoding according to FIG. 13. This prior art algorithm will generally be used for plural frames before the next I frame occurs. This situation enables almost ideal cache performance with little chance of repeated short term switches between algorithms.

Figure 19:
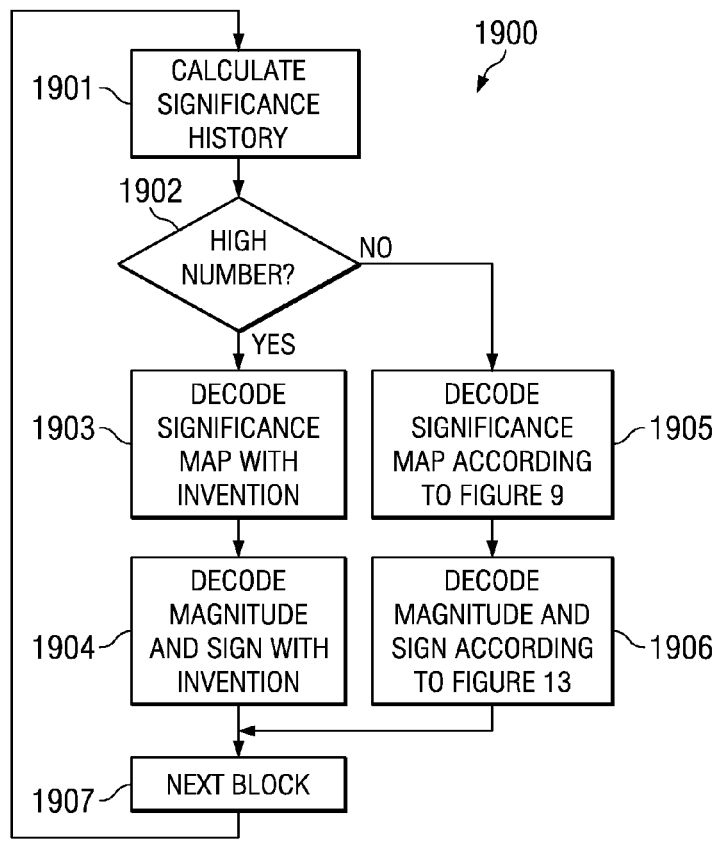
FIG. 19 illustrates a second method for selecting either the significance map decoding of this invention or of the prior art.

FIG. 19 illustrates a second method for selecting either the decoding of this invention or of the prior art. The technique of FIG. 19 operated on the block or sub-block level rather than on the frame level as illustrated in FIG. 18. Block 1901 calculates a history of the number of significant coefficients in a number of previous blocks. Test block 1902 determines if the calculated number is a high enough number to use this invention. If the calculated number is high enough (Yes at test block 1902), then block 1903 decodes this block using the significance map decoding technique of this invention as illustrated in FIG. 11. Block 1904 decodes this block using the coefficient magnitude and sign decoding of this invention as illustrated in FIGS. 14 and 15. If the calculated number is not high enough (No at test block 1902), then block 1905 decodes this block using the significance map decoding technique of the prior art as described in conjunction with FIG. 9. Block 1906 decodes this frame using the coefficient magnitude and sign decoding technique of the prior art as described in conjunction with FIG. 13. In either case, process 1900 proceeds to the next block (block 1907) and loops back to test block 1901.

There are numerous alternatives for determining which significance map decode method to use based upon the history of the number of significant coefficients in prior blocks or sub-blocks. A simple alternative is to select the method of this invention if the number of significant coefficients in the immediately prior block or sub-block exceeds a threshold. This simple method would select the prior art method otherwise. Busy images tend to cause blocks with significant frequency domain data to cluster. Thus the number of significant coefficients in the immediately prior block is predictive of the number of significant coefficients in the current block. This invention is most useful for such busy blocks.

This simple technique may cause problems where the number of significant coefficients hovers around the threshold value. In such an event, this simple technique may repetitively switch between the two decode methods. Such switching would tend to degrade performance by causing cache thrashing. In cache thrashing, much time is lost in swapping code between the two algorithms. This cache thrashing can be minimized by a hysteresis system. This method switches between the prior art method and the method of this invention if the number of significant coefficients of the prior block exceeds a first threshold. The method switches between the invention and the prior art when the number of significant coefficients of the prior block is less than a lower second threshold. If the number of significant coefficients in the last block is between the first and second thresholds, then the significance map decode method remains the same as for the prior block. If the intermediate range was carefully chosen to be where the two significance map decoding techniques provide similar performance, then code switching with the risk of cache thrashing would be minimized with a minimum of efficiency loss.

Another method to protect against cache thrashing is to use a history of the coefficients for more than one prior block. Thus the significance map decode method would not switch for a short lived change in the busyness of the image. The significance history could be a sum or a weighted sum of the number of significant coefficients for plural prior blocks. Such a sum may be used to make the decoder selection either with or without hysteresis.

What is claimed is:

1. A method of decoding coefficient magnitude and sign data in a block of compressed video data comprising the steps of:
for coefficients of a block of compressed video data:
decoding a next coefficient magnitude symbol using a selected context,
speculatively decoding next data assuming said next data is a coefficient sign,
selecting a next context for decoding a next significance symbol dependent upon a number of iterations decoding a current coefficient magnitude,
updating an iteration count and a coefficient count dependent upon said decoded symbol, and
confirming or aborting said speculatively decoded coefficient sign dependent upon whether decoded next data completes decoding of a coefficient magnitude,
until a coefficient count reaches a number of significant coefficients within said block.

2. The method of claim 1, wherein:
said step of selecting a next context includes:
selecting an ones context for an initial iteration of a coefficient,
selecting an abs context for an iteration count of a current coefficient less than of equal to a first predetermined number, and
selecting a constant context for an iteration count of said current coefficient greater than said first predetermined number.

3. The method of claim 2, further comprising:
exiting a loop if an iteration count of said current coefficient greater than a second predetermined number, said second predetermined number greater than said first predetermined number;
decoding an escape code coefficient magnitude and sign upon exiting said loop; and
re-entering said loop for a next coefficient upon decode of said escape code coefficient magnitude and sign.

4. The method of claim 3, wherein:
said step of decoding an escape code coefficient and magnitude includes:
initializing a loop variable,
decoding a next coefficient magnitude symbol using a selected decode technique,
speculatively decoding next data assuming said next data is a coefficient sign,
updating loop variables including
setting a flag if said decoded next coefficient magnitude symbol is 0,
if said flag is not set, incrementing a loop variable and selecting a first decode technique,
if said flag is set, decrementing said loop variable and selecting a second decode technique,
until said loop variable counts down to 0,
when said loop variable counts down to 0, confirming said speculatively decoded coefficient sign.

5. The method of claim 1, further comprising:
a software unrolled loop wherein each iteration of a coded loop operates on more than one iteration of a logical loop, each logical loop including
before decoding a coefficient magnitude symbol using a selected context speculatively loading a ones context for said next and an abs context for said current index count,
following decoding a coefficient magnitude symbol updating a corresponding context including storing said updated context at a corresponding address, and
following selecting a next context performing a read after write hazard check to determine if a speculatively loaded ones context or a speculatively loaded abs context has been updated since said speculative loading, and if so replacing said speculatively loaded context with said updated context.

6. The method of claim 5, wherein:
said step of performing a read after write hazard check includes comparing a location within a context array of said speculatively loaded context with a location within said context array of storing said updated context, a match of locations indicating a read after write hazard.

7. The method of claim 1, further comprising:
updating an iteration count upon each logical loop; and
resetting said iteration count if said decoded symbol is 0.

8. The method of claim 1, further comprising:
updating said coefficient count includes incrementing said coefficient count if said decoded symbol is 0.

9. The method of claim 1, further comprising:
receiving a significant coefficient array storing coefficient location indicators for each significant coefficient; and
storing a current coefficient loop count in a next location of a significant coefficient array.

10. A method of decoding context adaptive binary arithmetic coded video data including a coefficient magnitude and sign data for each significant coefficient in a block comprising the steps of:
determining whether a portion of video data has a high number of significant coefficients;
if said portion of video data has a high number of significant coefficients then for each coefficients of a block of compressed video data:
decoding a next coefficient magnitude symbol using a selected context,
speculatively decoding next data assuming said next data is a coefficient sign, selecting a next context for decoding a next significance symbol dependent upon a number of iterations decoding a current coefficient magnitude, updating an iteration count and a coefficient count dependent upon said decoded symbol, and confirming or aborting said speculatively decoded coefficient sign dependent upon whether decoded next data completes decoding of a coefficient magnitude, until a coefficient count reaches a number of significant coefficients within said block; and if said portion of video data does not have a high number of significant coefficients then for each element of each significance map of each block of compressed video data within said portion of video data:

selecting a ones context, decoding a next symbol using said ones context, if said decoded next symbol is 0, then decoding a coefficient sign and repeating for a next coefficient of a current block, if said decoded symbol is 1, then
selecting an abs context,
decoding a next symbol using said abs context,
if said decoded symbol is 0, then decoding a coefficient sign and repeating for a next coefficient of a current block, and
if said decoded symbol is 1 and a number of iterations is less than a first predetermined number, then repeating said steps of selecting an abs context and decoding a next symbol,
if said decoded symbol is 1 and a number of iterations is greater than said first predetermined number, then
selecting a constant context,
decoding a next symbol using said constant context,
if said decoded symbol is 0, then decoding a coefficient sign and repeating for a next coefficient of a current block, and
if said decoded symbol is 1, then repeating said steps of selecting an abs context and decoding a next symbol.

11. The method of claim 10, wherein:
said portion of video data is a frame of video data; and
said step of determining whether a portion of video data has said high number of significant coefficients consists of determining if a frame is an I frame not including prediction.

12. The method of claim 10, wherein:
said portion of video data is a block of a frame of video data;
said step of determining whether a portion of video data has said high number of significant coefficients consists of determining if a number of significant coefficients in an immediately prior block exceeds a predetermined number.

13. The method of claim 10, wherein:
said portion of video data is a block of a frame of video data;
said step of determining whether a portion of video data has said high number of significant coefficients includes
determining said portion of video data has said high number of significant coefficients if a number of significant coefficients in an immediately prior block exceeds a first predetermined number,
determining said portion of video data does not have said high number of significant coefficients if said number of significant coefficients in said immediately prior block is less than a second predetermined number, said second predetermined number being less than said first predetermined number,
determining said portion of video data has said high number of significant coefficients if said immediately prior block was determined to have said high number of significant coefficients and said number of significant coefficients in said immediately prior block is between said second predetermined number and said first predetermined number, and
determining said portion of video data does not have said high number of significant coefficients if said immediately prior block was determined not to have said high number of significant coefficients and said number of significant coefficients in said immediately prior block is between said second predetermined number and said first predetermined number.

14. The method of claim 10, wherein;
said portion of video data is a block of a frame of video data;
said step of determining whether a portion of video data has a high number of significant coefficients consists of determining if a history of a number of significant coefficients in plural prior blocks exceeds a predetermined number.

15. The method of claim 10, wherein:
said portion of video data is a block of a frame of video data;
said step of determining whether a portion of video data has said high number of significant coefficients includes
determining said portion of video data has said high number of significant coefficients if a history of said number of significant coefficients in plural prior blocks exceeds a first predetermined number,
determining said portion of video data does not have said high number of significant coefficients if said history of said number of significant coefficients in said plural prior blocks is less than a second predetermined number, said second predetermined number being less than said first predetermined number,
determining said portion of video data has said high number of significant coefficients if said immediately prior block was determined to have said high number of significant coefficients and said history of said number of significant coefficients in said plural prior blocks is between said second predetermined number and said first predetermined number, and
determining said portion of video data does not have said high number of significant coefficients if said immediately prior block was determined not to have said high number of significant coefficients and said history of said number of significant coefficients in said plural prior blocks is between said second predetermined number and said first predetermined number.

* * * * *